(12) United States Patent
Kim et al.

(10) Patent No.: US 9,029,888 B2
(45) Date of Patent: May 12, 2015

(54) HIGH EFFICIENCY LIGHT EMITTING DIODE AND METHOD OF FABRICATING THE SAME

(75) Inventors: Chang Yeon Kim, Ansan-si (KR); Da Hye Kim, Ansan-si (KR); Hong Chul Lim, Ansan-si (KR); Joon Hee Lee, Ansan-si (KR); Jong Kyun You, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 138 days.

(21) Appl. No.: 13/109,669

(22) Filed: May 17, 2011

(65) Prior Publication Data
US 2012/0119243 A1    May 17, 2012

(30) Foreign Application Priority Data

| May 18, 2010 | (KR) | .................... 10-2010-0046532 |
| Sep. 27, 2010 | (KR) | .................... 10-2010-0092991 |
| Sep. 29, 2010 | (KR) | .................... 10-2010-0094298 |
| Oct. 18, 2010 | (KR) | .................... 10-2010-0101227 |

(51) Int. Cl.
| H01L 33/00 | (2010.01) |
| H01L 33/38 | (2010.01) |
| H01L 33/46 | (2010.01) |
| H01L 33/22 | (2010.01) |

(52) U.S. Cl.
CPC .............. *H01L 33/38* (2013.01); *H01L 33/007* (2013.01); *H01L 33/0079* (2013.01); *H01L 33/22* (2013.01); *H01L 33/46* (2013.01)

(58) Field of Classification Search
CPC ............... H01L 33/387; H01L 23/142; H01L 23/49822; H01L 23/3735; H01L 33/38
USPC ............ 257/99, 91, 81, 98, 707, 706; 438/29
See application file for complete search history.

(56) References Cited

U.S. PATENT DOCUMENTS

| 6,744,071 B2* | 6/2004 | Sano et al. ..................... 257/79 |
| 7,659,553 B2 | 2/2010 | Kato et al. |

(Continued)

FOREIGN PATENT DOCUMENTS

| CN | 101393956 | 3/2009 |
| CN | 101626057 | 1/2010 |

(Continued)

OTHER PUBLICATIONS

Chinese Office Action issued on Dec. 23, 2014, in Chinese Patent Application No. 201110140245.0.

*Primary Examiner* — Yu-Hsi D Sun
(74) *Attorney, Agent, or Firm* — H.C. Park & Associates, PLC

(57) ABSTRACT

Exemplary embodiments of the present invention relate to a high-efficiency light emitting diode (LED). The LED according to an exemplary embodiment includes a substrate, a semiconductor stack arranged on the substrate, wherein the semiconductor stack has a p-type semiconductor layer, an active layer and an n-type semiconductor layer, a first metal layer interposed between the substrate and the semiconductor stack, the first metal layer ohmic-contacted with the semiconductor stack, a first electrode pad arranged on the semiconductor stack, an electrode extension extending from the first electrode pad, wherein the electrode extension has a contact region contacting the n-type semiconductor layer, a first insulating layer interposed between the substrate and the semiconductor stack, wherein the first insulating layer covers a surface region of the p-type semiconductor layer under the contact region of the electrode extension, and a second insulating layer interposed between the first electrode pad and the semiconductor stack.

13 Claims, 17 Drawing Sheets

(56) References Cited

U.S. PATENT DOCUMENTS

| | | | |
|---|---|---|---|
| 2003/0141506 A1 | 7/2003 | Sano et al. | |
| 2009/0072257 A1 | 3/2009 | Unno et al. | |
| 2009/0258248 A1* | 10/2009 | Tsushima | 428/656 |
| 2010/0163894 A1* | 7/2010 | Uemura et al. | 257/95 |

FOREIGN PATENT DOCUMENTS

| | | |
|---|---|---|
| JP | 2000-091638 | 3/2000 |
| JP | 2005-033197 | 2/2005 |
| JP | 2007-180302 | 7/2007 |
| JP | 2008-527713 | 7/2008 |
| JP | 2008-543068 | 11/2008 |
| JP | 2009-010215 | 1/2009 |
| KR | 10-2004-0073434 | 8/2004 |
| KR | 10-0876737 | 12/2008 |
| KR | 10-1014155 | 2/2011 |
| WO | 2006-073825 | 7/2006 |
| WO | 2006-128446 | 12/2006 |
| WO | 2009-084857 | 7/2009 |

* cited by examiner

HIGH EFFICIENCY LIGHT EMITTING DIODE AND METHOD OF FABRICATING THE SAME

CROSS-REFERENCE TO RELATED APPLICATIONS

This application claims priority from and the benefit of Korean Patent Application No. 10-2010-0046532, filed on May 18, 2010, Korean Patent Application No. 10-2010-0092991, filed on Sep. 27, 2010, Korean Patent Application No. 10-2010-0094298, filed on Sep. 29, 2010, and Korean Patent Application No. 10-2010-0101227, filed on Oct. 18, 2010, which are hereby incorporated by reference for all purposes as if fully set forth herein.

BACKGROUND OF THE INVENTION

1. Field of the Invention

Exemplary embodiments of the present invention relates to a light emitting diode (LED), and more particularly, to a GaN-based high-efficiency LED in which a growth substrate is removed using a substrate separation process.

2. Discussion of the Background

In general, since Group-III-element nitrides, such as gallium nitride (GaN) and aluminum nitride (AlN), have an excellent thermal stability and a direct-transition-type energy band structure, they have recently come into the spotlight as materials for light emitting diodes (LEDs) in visible and ultraviolet regions. Particularly, blue and green light emitting devices using indium gallium nitride (InGaN) have been used in various applications such as large-sized full-color flat panel displays, traffic lights, indoor illuminators, high-density light sources, high-resolution output systems and optical communications.

Since it may be difficult to form a homogeneous substrate on which a Group-III-element nitride semiconductor layer can be grown, the Group-III-element nitride layer may be grown on a heterogeneous substrate having a crystalline structure similar to the nitride semiconductor layer through a process such as metal organic chemical vapor deposition (MOCVD) or molecular beam epitaxy (MBE). A sapphire substrate with a hexagonal system structure may be used as the heterogeneous substrate. However, since sapphire is an electrical non-conductor, the structure of an LED using a sapphire substrate may be limited. Accordingly, there has recently been developed a technique in which epitaxial layers such as nitride semiconductor layers are grown on a heterogeneous substrate such as a sapphire substrate, a support substrate is bonded to the epitaxial layers, and the heterogeneous substrate is then separated using a laser lift-off technique or the like, thereby fabricating a high efficiency vertical LED (for example, see U.S. Pat. No. 6,744,071, issued to Sano, et al.).

Generally, a vertical LED may have an excellent current spreading performance thanks to a structure in which a p-type semiconductor layer is positioned at a lower portion in the vertical LED as compared with a conventional horizontal LED, and may have an excellent heat dissipation performance by employing a support substrate having a thermal conductivity higher than that of the sapphire substrate. Further, light emitted toward the support substrate can be reflected by disposing a reflective metal layer between the support substrate and a p-type semiconductor layer, and a roughened surface may be formed on an n-type semiconductor layer by anisotropically etching an N-face through photo-enhanced chemical (PEC) etching or the like, so that the upward light extraction efficiency may be considerably improved.

However, since the entire thickness (about 4 μm) of an epitaxial layer may be very thin as compared with the light emitting area, for example, of 350 μm×350 μm or 1 mm$^2$, it may be very difficult to implement the current spreading. To solve such a problem, a technique for promoting current spreading in an n-type layer involves using an electrode extension extending from an n-type electrode pad, or current may be prevented from directly flowing from the n-type electrode pad to a p-type electrode by disposing an insulating material at the position of the p-type electrode corresponding to the n-type electrode pad. However, there may be a limitation on preventing the current flow from being concentrated from the n-type electrode pad toward a portion just under the n-type electrode pad. Moreover, there may be a limitation on uniformly spreading the current throughout a wide light emitting area.

Particularly, the current concentration may accumulate fatigues in a partial region of the LED, i.e., a region on which the current is concentrated, and therefore, a leakage current path may be formed in the region. For this reason, the current concentration in the region just under an electrode pad may hinder applying the LED having the vertical structure as an LED for illumination, which requires a high reliability. Particularly, in case of a high-luminance LED used for illumination, a minute current concentration may deteriorate the light emitting efficiency of the LED and may have a bad influence on the lifespan thereof.

Meanwhile, a process for fabricating a vertical LED, e.g., a process of growing an epitaxial layer on a growth substrate or bonding a support substrate to the epitaxial layer, is performed at a relatively high temperature. The growth substrate, the epitaxial layer and the support substrate may have different thermal expansion coefficients from one another. Hence, after the process is completed at the high temperature, a stress is applied into the relatively thin epitaxial layer, thereby inducing a residual stress. While the growth substrate may be separated through a laser lift-off process, physical damage such as cracks may be easily generated in the epitaxial layer by the residual stress. Moreover, a shock wave may be transferred to the epitaxial layer due to the emission of a laser beam in the laser lift-off process, and therefore, which may damage the epitaxial layer.

In addition, a surface of the epitaxial layer may not be flat and may have a locally concave or convex portion due to the difference of thermal expansion coefficients between the growth substrate and the epitaxial layer. Accordingly, when the support substrate is bonded to the epitaxial layer, microbubbles may be formed between the epitaxial layer and the support substrate.

SUMMARY OF THE INVENTION

Exemplary embodiments of the present invention provide a high efficiency light emitting diode (LED) having an improved current spreading performance and a method of fabricating the same.

Exemplary embodiments of the present invention also provide a high efficiency LED having an improved light extraction efficiency and a method of fabricating the same.

Exemplary embodiments of the present invention also provide a high efficiency LED and a method of fabricating the same capable of reducing the damage of an epitaxial layer during a fabrication process.

Additional features of the invention will be set forth in the description which follows, and in part will be apparent from the description, or may be learned by practice of the invention.

An exemplary embodiment of the present invention discloses a light emitting diode including a substrate, a semiconductor stack arranged on the substrate, the semiconductor stack including a p-type semiconductor layer, an active layer and an n-type semiconductor layer, a first metal layer interposed between the substrate and the semiconductor stack, the first metal layer ohmic-contacted with the semiconductor stack, a first electrode pad arranged on the semiconductor stack, an electrode extension extending from the first electrode pad, the electrode extension having a contact region contacting the n-type semiconductor layer, a first insulating layer interposed between the substrate and the semiconductor stack, the first insulating layer covering a first region of the p-type semiconductor layer under the contact region of the electrode extension, and a second insulating layer interposed between the first electrode pad and the semiconductor stack.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
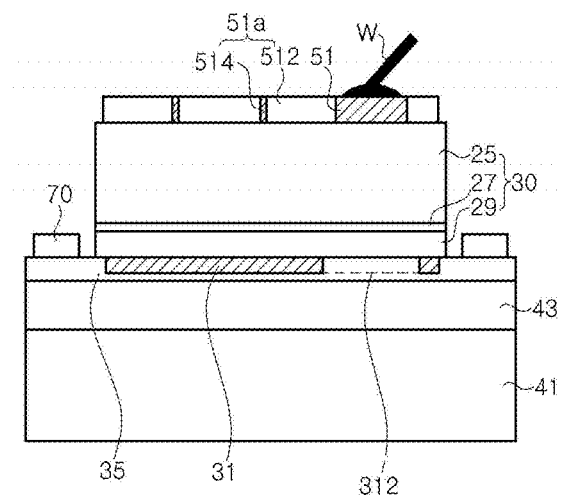
FIG. 1 is a sectional view of a high-efficiency light emitting diode (LED) according to an exemplary embodiment of the present invention.

Hereinafter, exemplary embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

FIG. 1 is a sectional view of a high-efficiency light emitting diode (LED) according to an exemplary embodiment of the present invention.

As shown in FIG. 1, the high-efficiency LED according to the present exemplary embodiment includes a support substrate 41, a semiconductor stack 30 disposed on the support substrate 41, and an intermediate layer disposed between the semiconductor stack 30 and the support substrate 41. The intermediate layer may include multi-layered metal layers (e.g., 31, 35, and 43 as shown in FIG. 1) for ohmic contact, light reflection, and bonding between the support substrate 41 and the semiconductor stack 30.

The support substrate 41 is distinguished from a growth substrate (not shown) for growing compound semiconductor layers, and is a secondary substrate attached to the compound semiconductor layers grown on the growth substrate. The growth substrate may be a sapphire substrate suitable for the growth of a Group-III nitride semiconductor. In the present exemplary embodiment, if another sapphire substrate is used as the support substrate 41, the growth substrate and the support substrate 41 have the same thermal expansion coefficient, so that the wafer can be prevented from being bent when the support substrate 41 is bonded and the growth substrate is removed.

The semiconductor stack 30 is disposed on the support substrate 41, and includes an active layer 27 and p-type and n-type compound semiconductor layers 29 and 25 respectively disposed at both sides of the active layer 27. In the semiconductor stack 30, the p-type compound semiconductor layer 29 is positioned closer to the support substrate 41 as compared with the n-type compound semiconductor layer 25, similarly to a conventional vertical LED. In the present exemplary embodiment, the semiconductor stack 30 is positioned on a partial region of the support substrate 41, and a p-type bonding pad 70 may be disposed on the other region of the support substrate 41 on which there is no semiconductor stack 30. Since the support substrate 41 is insulating, a portion of the electrically conductive intermediate layer extends in a lateral direction of the semiconductor stack 30, so that the extended portion of the intermediate layer can be connected to the p-type bonding pad 70.

The p-type compound semiconductor layer 29, the active layer 27, and the n-type compound semiconductor layer 25 may be formed of a III-N-based compound semiconductor, e.g., an (Al, Ga, In)N semiconductor. Each of the n-type and p-type semiconductor layers 25 and 29 may have a single- or multi-layered structure. For example, the n-type semiconductor layer 25 and/or the p-type semiconductor layer 29 may include a contact layer and a clad layer, and may further include a superlattice layer. In addition, the active layer 27 may have a single or multiple quantum well structure. The n-type compound semiconductor layer 25 with relatively small specific resistance is positioned at the opposite side of the support substrate 41, so that it may be easy to form a roughened or textured surface on a top surface of the n-type compound semiconductor layer 25. The roughened or textured surface may improve the extraction efficiency of the light generated in the active layer 27. If the support substrate 41 is not made of an insulating substrate such as sapphire, but a metal or a conductive semiconductor, the p-type bonding pad 70 may be formed on a bottom surface of the support substrate 41.

Meanwhile, a p-ohmic electrode 31 may be positioned between the support substrate 41 and the semiconductor stack 30 so as to be ohmic-contacted with the p-type compound semiconductor layer 29. An n-electrode pad 51 is positioned on the semiconductor stack 30, and an electrode extension 51a is extended from the n-electrode pad 51. The n-electrode pad 51 and the electrode extension 51a may be ohmic-contacted with the n-type compound semiconductor layer 25. The high-efficiency LED further includes a barrier metal layer 35 and a bonding metal 43, which are sequentially disposed between the p-ohmic electrode 31 and the support substrate 41. The barrier metal layer 35 is in contact with the p-ohmic electrode 31, and the bonding metal 43 is in contact with the barrier metal layer 35 and the support substrate 41 at upper and lower sides thereof, respectively.

In the present exemplary embodiment, the bonding metal 43 is used to bond the semiconductor stack 30 to the support substrate 41. At this time, the bonding metal 43 may be formed by bonding a bonding metal layer positioned on the semiconductor stack 30 to another bonding metal layer positioned on the support substrate 41, and the support substrate 41 and the semiconductor stack 30 are adhered to each other using eutectic bonding of the boding metal layers. The bonding metal 43 may include an Au—Sn alloy.

In the present exemplary embodiment, the p-ohmic electrode 31 may be an ohmic reflective metal layer including a reflective metal such as Ag, and a partial region within the p-ohmic electrode 31, positioned at the same height as the p-ohmic electrode 31, is left as a groove region 312. For convenience of understanding, the groove region 312 is designated by a dotted line in FIG. 1. The groove region 312, which will be described below, is positioned close to a corner of the p-type compound semiconductor layer 29 so as to correspond to the position of the n-electrode pad 51 on the n-type compound semiconductor layer 25. In the present exemplary embodiment, the groove region 312 is filled with the barrier metal layer 35 positioned therebeneath. The barrier metal layer 35 is formed, for example, of a metal such as Ni, which may not be well ohmic-contacted with the p-type compound semiconductor layer 29, and thus the current flow can be restricted in the groove region 312.

A bonding wire W may be connected to the n-electrode pad 51, and the electrode extension 51a extends from the n-electrode pad 51.

Figure 2:
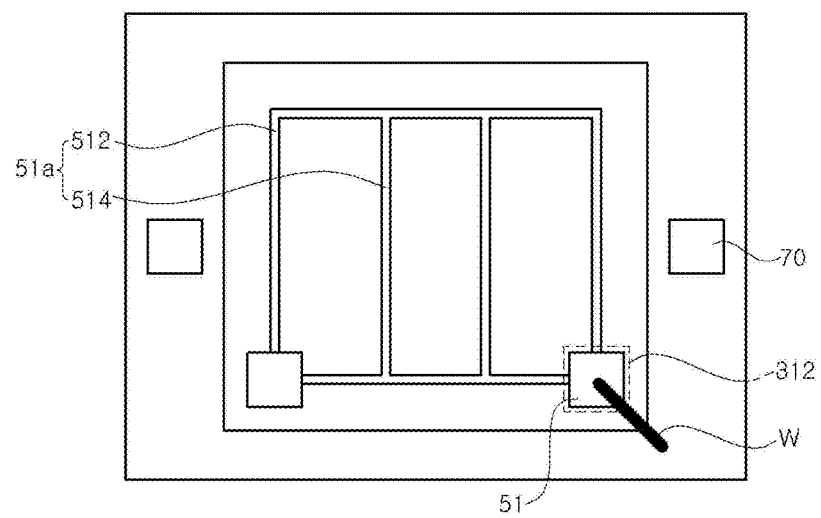
FIG. 2 is a plan view showing a top surface of the high-efficiency LED shown in FIG. 1.

FIG. 2 is a plan view showing a top surface of the device shown in FIG. 1.

Referring to FIG. 2, the n-electrode pad 51 is spaced away from a central region of the n-type compound semiconductor layer 25 and close to a corner of the n-type compound semiconductor layer 25. Thus, a light emitting region on the n-type compound semiconductor layer 25 may be minimally covered by the bonding wire W. The electrode extension 51a linearly extends from the n-electrode pad 51. More specifically, the electrode extension 51a may include a closed-loop-type external electrode pattern 512 starting from the n-electrode pad 51 and returning to the n-electrode pad 51, and a plurality of internal electrode patterns 514 each having both ends connected to two different positions of the external electrode pattern 512, respectively.

Referring back to FIG. 1, the n-electrode pad 51 is positioned in a region opposite to the groove region 312 in which there is no p-ohmic electrode 31, i.e., a region immediately above the groove region 312, as described above. The electrode extension 51a extends from the n-electrode pad 51 to an upper portion of the region of the p-ohmic electrode 31. Therefore, the path for the current is substantially blocked between the n-electrode pad 51 on the n-type compound semiconductor layer 25 and the groove region 312 on the p-type compound semiconductor layer 29, which is positioned immediately under the n-electrode pad 51. Accordingly, the current passing through the electrode extension 51a on the n-type compound semiconductor layer 25 may be increased, and the current between the electrode extension 51a and the p-ohmic electrode 31 may also be increased. Thus, the current may be more effectively spread. In the present exemplary embodiment, the spreading efficiency of the current may be increased by appropriately controlling the pattern of the electrode extension 51a as long as the top surface of the n-type compound semiconductor layer 25 is not excessively covered by the electrode extension 51a. Excessively covering the n-type compound semiconductor layer 25 with the electrode extension 51a may result in decreased light emission efficiency.

Figure 3:
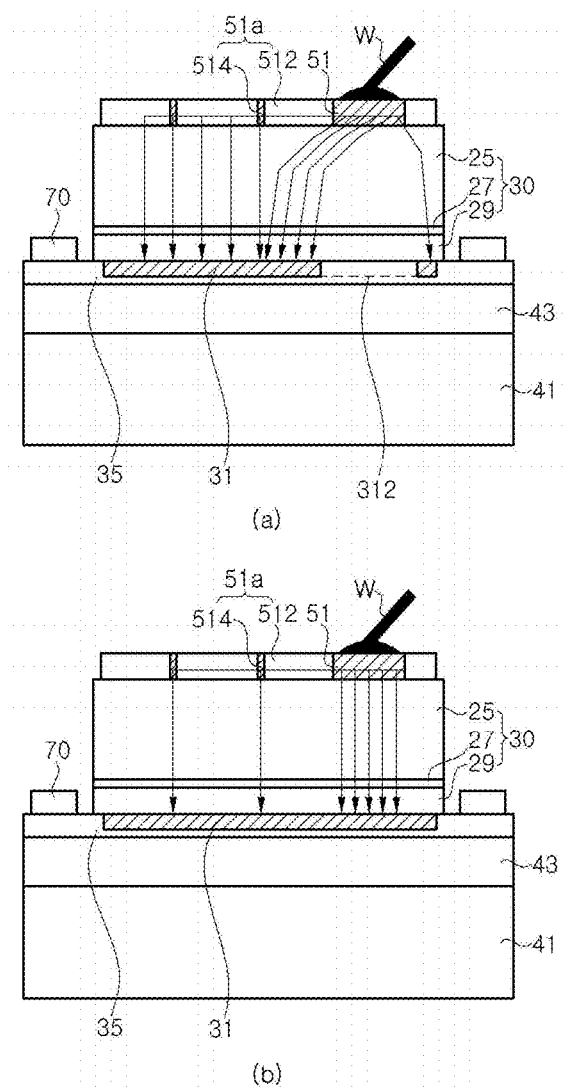
FIGS. 3a and 3b are views comparing current flow according to an exemplary embodiment of the present invention with current flow according to a comparative example.

FIGS. 3a and 3b are views comparing the differences in the contribution degrees of the electrode extension 51a for the increase in the current spreading depending on whether or not the groove region 312 is formed. FIGS. 3a and 3b show that the current spreading (shown in the direction of arrows) between the electrode extension 51a and the p-ohmic electrode 31 is increased in a case where the groove region 312 is formed (see FIG. 3a), as compared with a case where no groove region is formed (see FIG. 3b).

Figure 4:
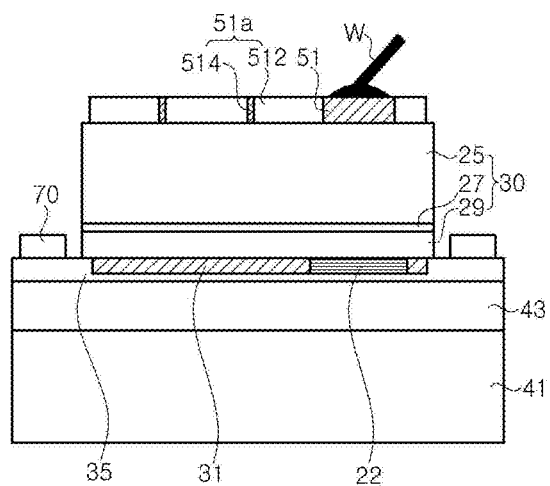
FIG. 4 is a sectional view of a high-efficiency LED according to an exemplary embodiment of the present invention.

FIG. 4 is a sectional view of a high-efficiency LED according to an exemplary embodiment of the present invention.

Referring to FIG. 4, the high-efficiency LED according to the present exemplary embodiment is similar to the LED described with reference to FIG. 1, but includes an insulating layer 22 configured to be a distributed Bragg reflector (hereinafter, referred to as an 'insulation DBR') that fills the groove region 312 and is in contact with the p-type compound semiconductor layer 29. The insulation DBR 22 is in contact with the p-type compound semiconductor layer 29 positioned at a lower portion of the semiconductor stack 30, together with the p-ohmic electrode 31, i.e., the ohmic reflective metal layer, which is positioned around the insulation DBR 22.

The insulation DBR 22 may be formed by alternately stacking at least two high and low refractive index layers selected from $Si_xO_yN_z$, $Ti_xO_y$, $Ta_xO_y$ and $Nb_xO_y$. The reflectance for the light in a specific wavelength can be maximized by adjusting the optical thickness of the high and low refractive index layers which are alternately stacked. At this time, the layers in the insulation DBR 22 may have the same optical thickness so as to increase the reflectance for the light in a specific wavelength, such as the light generated in the active layer 27. Alternatively, the insulation DBR 22 may be formed by stacking a plurality of DBRs whose reflection wavelengths are different from each other so as to increase the reflectance for the light in a relatively wide wavelength region. The reflection wavelength of each insulation DBR 22 may be controlled by the optical thickness of the high and low refractive index layers.

In view of the reflection of the light in a specific wavelength, the insulation DBR 22 may include a single DBR formed by repeatedly stacking one high refractive index layer and one low refractive index layer in a vertical direction. However, if the aforementioned LED is a white LED applied to an LED package that emits white light, the insulation DBR 22 may have a structure including two or more insulation DBR portions, thereby improving the light emission efficiency. Hereinafter, other examples of the insulation DBR 22 applicable to the aforementioned LED will be described, in which two or more insulation DBR portions are configured to be stacked so as to be suitable for reflecting the light in two or more different wavelengths.

Figure 5:
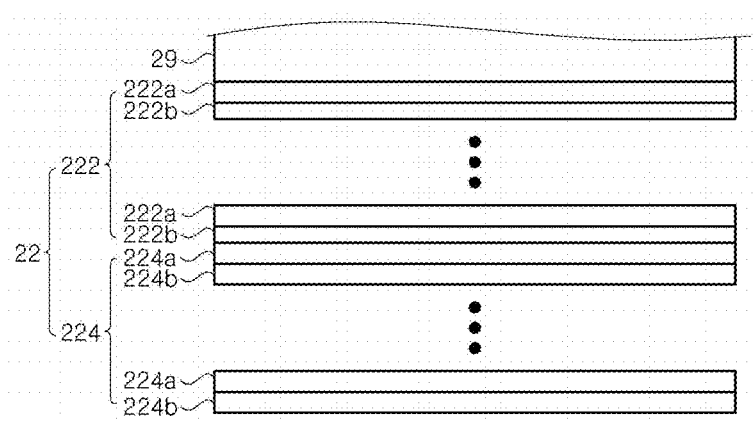
FIG. 5 and FIG. 6 are views showing a distributed Bragg reflector (DBR) applicable as a reflection structure according to exemplary embodiments of the present invention.

Referring to FIG. 5, an insulation DBR 22 includes a first insulation DBR portion 222 and a second insulation DBR portion 224.

The first insulation DBR portion 222 is formed by repeating a plurality of pairs of first and second material layers 222a and 222b, and the second insulation DBR portion 224 is formed by repeating a plurality of pairs of third and fourth material layers 224a and 224b. The pairs of first and second material layers 222a and 222b in the first insulation DBR portion 222 may have a relatively high reflectance with respect to the light in a red or green wavelength region, e.g., light of 550 mm or 630 nm, as compared with the light in a blue wavelength region, and the pairs of third and fourth material layers 224a and 224b in the second insulation DBR portion 224 may have a relatively high reflectance with respect to the light in a blue wavelength region, e.g., light of 460 nm, as compared with the light in a red or green wavelength region. Although the optical thickness of the material layers 222a and 222b in the first insulation DBR portion 222 is greater than that of the material layers 224a and 224b in the second insulation DBR portion 224, the present invention is not limited thereto. That is, the optical thickness of the material layers in the second insulation DBR portion may be greater than that of the material layers in the first insulation DBR portion.

The first material layer 222a may have the same material as the third material layer 224a, i.e., the same refractive index, and the second material layer 222b may have the same material as the fourth material layer 224b, i.e., the same refractive index. For example, the first and third material layers 222a and 224a may be formed of $TiO_2$ (refractive index n: about 2.5), and the second and fourth material layers 222b and 224b may be formed of $SiO_2$ (refractive index n: about 1.5).

Meanwhile, the optical thickness of the first material layer 222a is substantially in an integer time relationship with that of the second material layer 222b, and it may be preferable that their optical thicknesses are substantially identical to each other. The optical thickness of the third material layer 224a is substantially in an integer time relationship with that of the fourth material layer 224b, and their optical thicknesses may be substantially identical to each other.

The optical thickness of the first material layer 222a may be greater than that of the third material layer 224a, and the optical thickness of the second material layer 222b may be greater than that of the fourth material layer 224b. The optical thickness of the first to fourth material layers 222a, 222b, 224a and 224b may be controlled by adjusting the refractive index and/or the actual thickness of each of the material layers.

According to the present exemplary embodiment, there is provided the insulation DBR 22 in which the first insulation DBR portion 222 having a relatively higher reflectance for a long wavelength visible light and the second insulation DBR portion 224 having a relatively higher reflectance for a short wavelength visible light are configured to be stacked with each other. The insulation DBR 22 can have a high reflectance throughout a wide wavelength band in the visible light region by the combination of the first and second insulation DBR portions 222 and 224.

Since a single DBR has a high reflectance with respect to the light in a specific wavelength range but a low reflectance with respect to the light in the other wavelength ranges, there may be a limitation on improving the light extraction efficiency of the LED package that emits white light. However, since the insulation DBR 22 including two or more DBR portions as shown in FIG. 5 has a high reflectance not only with respect to the light in a blue wavelength region but also the light in green and red wavelength regions, the light efficiency of the LED package may be improved.

Moreover, when the first insulation DBR portion 222 is disposed closer to the semiconductor stack 30 than the second insulation DBR portion 224, the light loss in the insulation DBR 22 may be reduced as compared with when the second insulation DBR portion 224 is disposed closer to the semiconductor stack 30 than the first insulation DBR portion 222.

In the present exemplary embodiment, the two reflectors, i.e., the first and second insulation DBR portions 222 and 224, have been described, but a larger number of DBRs may be used. DBRs having a relatively high reflectance with respect to the light in a relatively long wavelength may be positioned relatively close to the semiconductor stack 30.

In the present exemplary embodiment, the thicknesses of the first material layers 222a in the first insulation DBR portion 222 may be different from one another, and the thicknesses of the second material layers 222b in the first insulation DBR portion 222 may be different from one another. The thicknesses of the third material layers 224a in the second insulation DBR portion 224 may be different from one another, and the fourth material layers 224b in the second insulation DBR portion 224 may be different from one another.

Although it has been described in the present exemplary embodiment that the material layers 222a, 222b, 224a and 224b are formed of $SiO_2$ or $TiO_2$, the present invention is not limited thereto. The material layers may be formed of other material layers, for example, $Si_3N_4$, a compound semiconductor, or the like. The difference between the refractive indices of the first and second material layers 222a and 222b may be greater than 0.5, and the difference between the refractive indices of the third and fourth material layers 224a and 224b may be greater than 0.5.

The more the number of the pairs of first and second material layers in the first insulation DBR portion 222 and the number of the pairs of third and fourth material layers in the second insulation DBR portion 224, the more increased the reflectance may be. The total number of these pairs may be at least 20.

Figure 6:
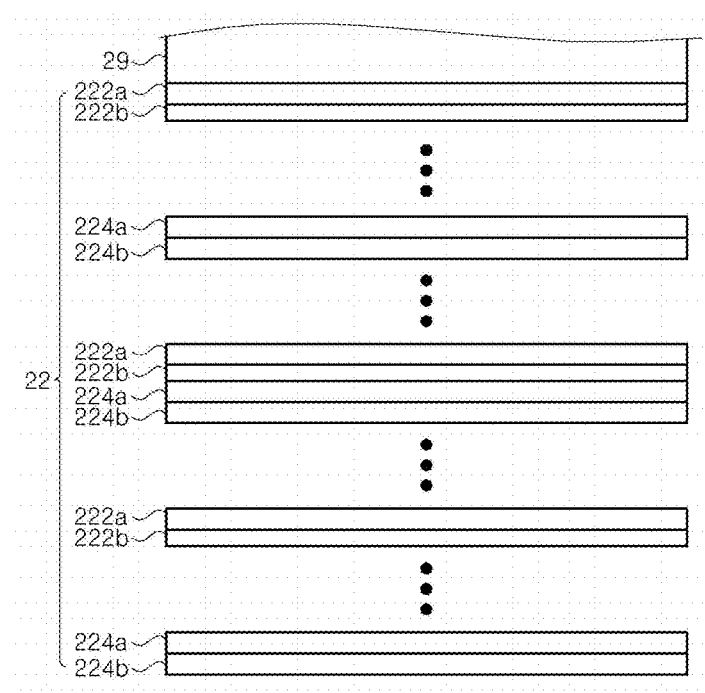

FIG. 6 is a sectional view illustrating an insulation DBR 22 according to an exemplary embodiment of the present invention. In the insulation DBR 22 according to the present exemplary embodiment, a plurality of pairs of first and second material layers 222a and 222b and a plurality of pairs of third and fourth material layers 224a and 224b are mixed with each other. That is, at least one pair of third and fourth material layers 224a and 224b is positioned between the plurality of pairs of first and second material layers 222a and 222b, and at least one pair of first and second material layers 222a and 222b are positioned between the plurality of pairs of third and fourth material layers 224a and 224b. Here, the optical thickness of the first to fourth material layers 222a, 222b, 224a and 224b is controlled to have a high reflectance for light throughout a wide wavelength band in the visible light region.

Figure 7:
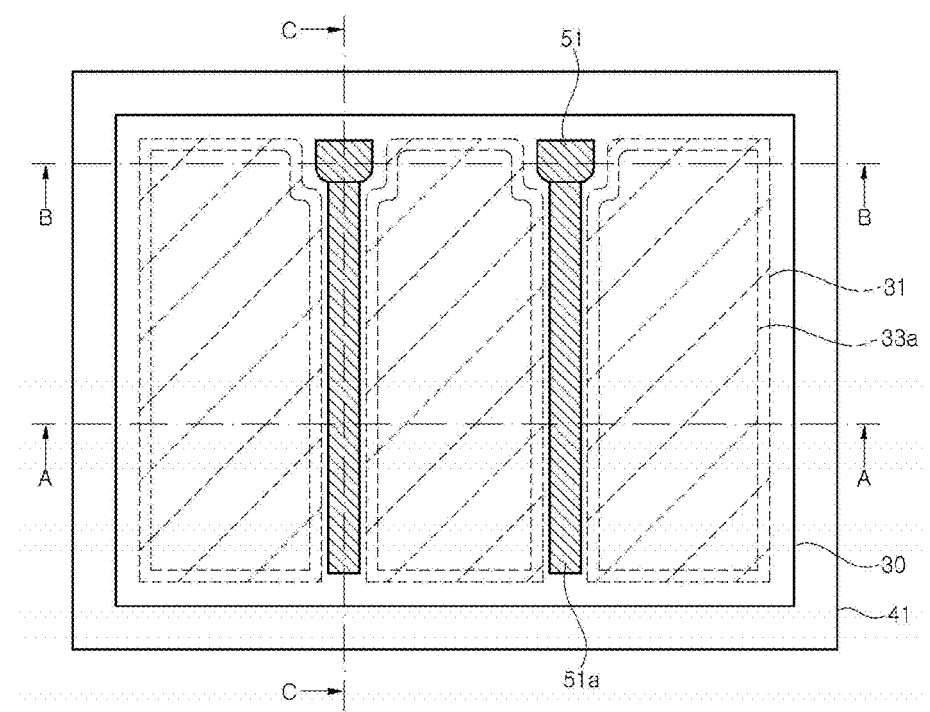
FIG. 7 is a schematic layout of an LED according to an exemplary embodiment of the present invention.
Figure 8:
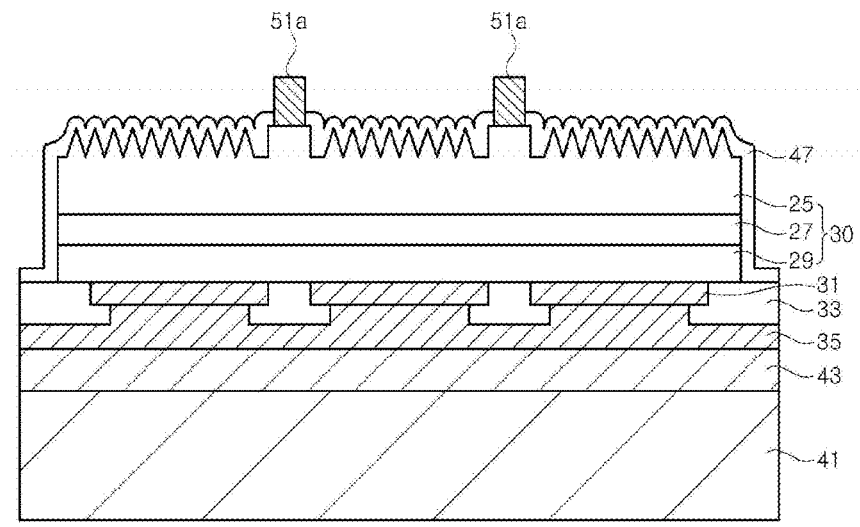
FIG. 8 is a sectional view taken along line A-A of FIG. 7.
Figure 9:
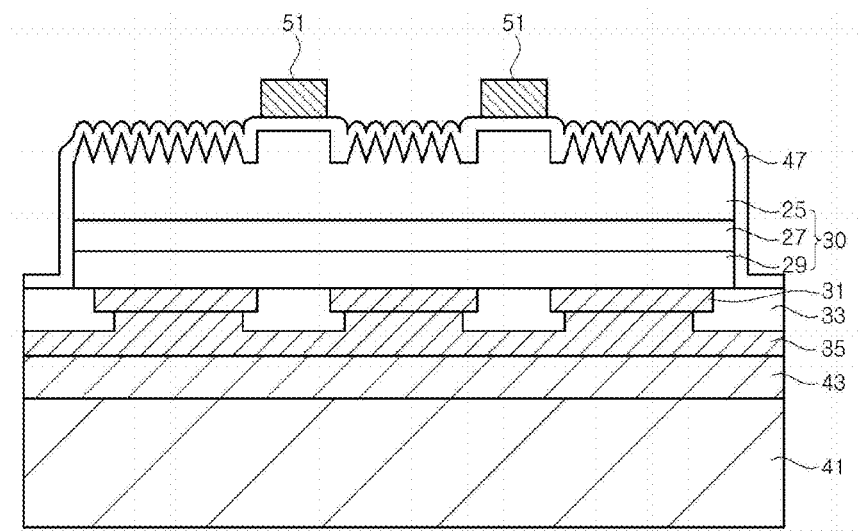
FIG. 9 is a sectional view taken along line B-B of FIG. 7.
Figure 10:
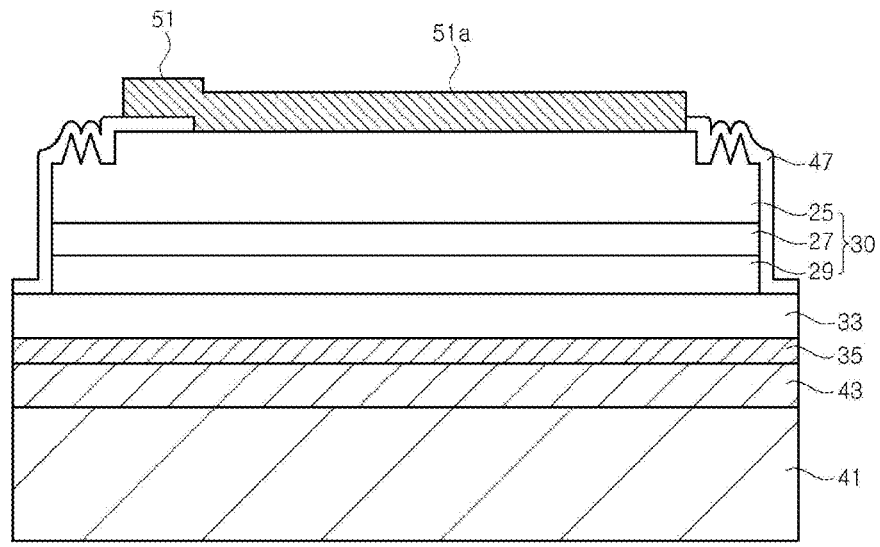
FIG. 10 is a sectional view taken along line C-C of FIG. 7.

FIG. 7 is a schematic layout of an LED according to an exemplary embodiment of the present invention. FIGS. 8, 9, and 10 are sectional views taken along lines A-A, B-B and C-C, respectively, of FIG. 7. In FIG. 7, a reflective metal layer 31 and a lower insulating layer 33, positioned beneath a semiconductor stack 30, are designated by dotted lines.

Referring to FIGS. 7 to 10, the LED includes a support substrate 41, a semiconductor stack 30, a reflective metal layer 31, a lower insulating layer 33, a barrier metal layer 35, an upper insulating layer 47, an n-electrode pad 51 and an electrode extension 51a. The LED may further include a bonding metal 43.

The support substrate 41 is distinguished from a growth substrate (not shown) for growing compound semiconductor layers, and is a secondary substrate attached to the previously grown compound semiconductor layers. Although the support substrate 41 may be a conductive substrate, e.g., a metallic substrate, or a semiconductor substrate, the present invention is not limited thereto. That is, the support substrate 41 may be an insulating substrate such as a sapphire substrate.

The semiconductor stack 30 is positioned on the support substrate 41, and includes a p-type compound semiconductor layer 29, an active layer 27 and an n-type compound semiconductor layer 25. In the semiconductor stack 30, the p-type compound semiconductor layer 29 is positioned closer to the support substrate 41 as compared with the n-type compound semiconductor layer 25, similarly to the conventional vertical LED. The semiconductor stack 30 may be positioned on a partial region of the support substrate 41. That is, the support substrate 41 has a relatively wider area than the semiconductor stack 30, and the semiconductor stack 30 is positioned within the region surrounded by an edge of the support substrate 41.

Since the n-type compound semiconductor 25, the active layer 27 and the p-type compound semiconductor layer 29 are identical to those described with reference to FIG. 1, their detailed descriptions will be omitted.

A p-electrode is positioned between the p-type compound semiconductor layer 29 and the support substrate 41, and may include a reflective metal layer 31 and a barrier metal layer 35. The reflective metal layer 31 is ohmic-contacted with the p-type compound semiconductor layer 29 between the semiconductor stack 30 and the support substrate 41. The reflective metal layer 31 may include a reflection layer, for example, of Ag. The reflective metal layer 31 may be positioned to be confined beneath the region of the semiconductor stack 30. As shown in FIG. 7, the reflective metal layer 31 may be formed of a plurality of plates, wherein grooves are formed between the plates. The semiconductor stack 30 is exposed through the grooves.

The lower insulating layer 33 covers the reflective metal layer 31 between the reflective metal layer 31 and the support substrate 41. The lower insulating layer 33 covers side surfaces and edges of the reflective metal layer 31, e.g., the plurality of plates, and has openings through which the reflective metal layer 31 is exposed. The lower insulating layer 33 may be formed to have a single- or multi-layered structure made of silicon oxide or silicon nitride, and may be a DBR obtained by repeatedly stacking insulating layers, e.g., $SiO_2$/$TiO_2$ or $SiO_2$/$Nb_2O_5$, whose refractive indices are different from each other. The lower insulating layer 33 can prevent the side surfaces of the reflective metal layer 31 from being exposed to the outside. The lower insulating layer 33 may also be positioned beneath side surfaces of the semiconductor stack 30, so that the leakage current through the side surfaces of the semiconductor stack 30 can be prevented.

The barrier metal layer 35 covers the lower insulating layer 33 beneath the lower insulating layer 33, and is connected to the reflective metal layer 31 through the openings of the lower insulating layer 33. The barrier metal layer 35 protects the reflective metal layer 31 by preventing the dispersion of a metallic material from the reflective metal layer 31, e.g., Ag. The barrier metal layer 35 may include, for example, a Ni layer. The barrier metal layer 35 may be positioned over the whole surface of the support substrate 41.

The support substrate 41 may be bonded onto the barrier metal layer 35 by means of a bonding metal 43. The bonding metal 43 may be formed of, for example, Au—Sn using an eutectic bonding. Alternatively, the support substrate 41 may be formed on the barrier metal layer 35, for example, using a plating technique. If the support substrate 41 is a conductive substrate, it may perform the function of the p-electrode pad. Alternatively, if the support substrate 41 is an insulating substrate, the p-electrode pad may be formed on the barrier metal layer 35 positioned on the support substrate 41.

Meanwhile, a top surface of the semiconductor stack 30, i.e., a surface of the n-type compound semiconductor layer 25, may have a both roughened surface and a flat surface. As shown in FIGS. 8 to 10, the n-electrode pad 51 and the electrode extension 51a are positioned on the flat surface. As shown these figures, the n-electrode pad 51 and the electrode extension 51a are positioned to be confined on the flat surface, and may be narrower than the flat surface. Thus, the n-electrode pad 51 or the electrode extension 51a may be prevented from being exfoliated by the generation of an undercut or the like in the semiconductor stack 30, thereby improving the reliability thereof. The roughened surface may also be positioned under the flat surface. That is, the roughened surface may be positioned under the n-electrode pad 51 and the electrode extension 51a.

Meanwhile, the n-electrode pad 51 is positioned on the semiconductor stack 30, and the electrode extension 51a extends from the n-electrode pad 51. A plurality of n-electrode pads 51 may be positioned on the semiconductor stack 30, and electrode extensions 51a may extend from the n-electrode pads 51, respectively. The electrode extensions 51a are electrically connected to the semiconductor stack 30, and may come in direct contact with the n-type compound semiconductor layer 25.

The n-electrode pad 51 may also be positioned above a groove region in the reflective metal layer 31. That is, the reflective metal layer 31 ohmic-contacted with the p-type compound semiconductor layer 29 may not be positioned under the n-electrode pad 51, but the lower insulating layer 33 is positioned under the n-electrode pad 51 instead. Further, the electrode extension 51a may also be positioned above the groove region in the reflective metal layer 31. As shown in FIG. 7, in the reflective metal layer 31, which is composed of a plurality of plates, the electrode extension 51a may be positioned above a region between the plates. The width of the groove region in the reflective metal layer 31, e.g., the region between the plurality of plates, may be wider than the electrode extension 51a. Accordingly, the current flow may be prevented from being concentrated from the electrode extension 51a toward a portion just under the electrode extension 51a.

Meanwhile, the upper insulating layer 47 is interposed between the n-electrode pad 51 and the semiconductor stack 30. The upper insulating layer 47 can prevent the current from directly flowing into the semiconductor stack 30 from the n-electrode pad 51. Particularly, the upper insulating layer 47 can prevent the current from being concentrated on a portion just under the n-type electrode pad 51. The upper insulating layer 47 covers the roughened surface. The upper insulating layer 47 may have an uneven surface formed along the roughened surface. The uneven surface of the upper insulating layer 47 may have a convex shape. The uneven surface of the upper insulating layer 47 can decrease the internal total reflection which may be generated on an upper surface of the upper insulating layer 47.

The upper insulating layer 47 may cover the side surfaces of the semiconductor stack 30 so as to protect the semiconductor stack 30 from an external environment. Further, the upper insulating layer 47 may have an opening through which the semiconductor stack 30 is exposed, and the electrode extension 51a may be positioned in the opening so as to be in contact with the semiconductor stack 30.

FIGS. 11 to 15 are sectional views illustrating a method of fabricating the LED according to an exemplary embodiment of the present invention. Here, each of the sectional views corresponds to the sectional view taken along line A-A of FIG. 7.

Figure 11:
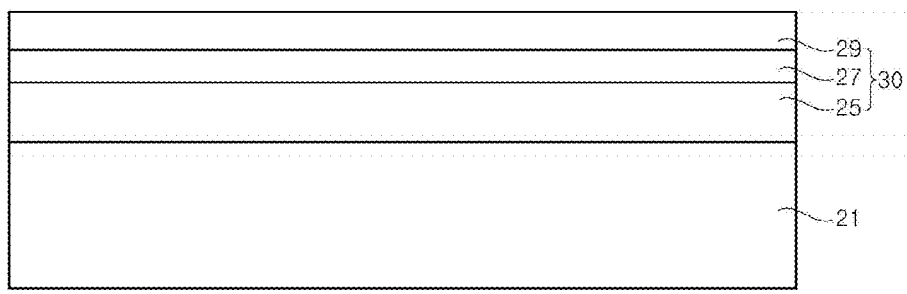
FIG. 11, FIG. 12, FIG. 13, FIG. 14, and FIG. 15 are sectional views illustrating a method of fabricating the LED according to an exemplary embodiment of the present invention, each of which corresponds to the sectional view taken along line A-A of FIG. 7.

Referring to FIG. 11, a semiconductor stack 30 including an n-type semiconductor layer 25, an active layer 27 and a p-type semiconductor layer 29 is formed on a growth substrate 21. Although the growth substrate 21 may be a sapphire substrate, the present invention is not limited thereto. That is, the growth substrate 21 may be another heterogeneous substrate, e.g., a silicon substrate. Each of the n-type and p-type semiconductor layers 25 and 29 may be formed to have a single- or multi-layered structure. The active layer 27 may be formed to have a single or multiple quantum well structure.

The semiconductor layers may be formed of III-N-based compound semiconductor, and may be grown on the growth substrate 21 through a process such as MOCVD or MBE.

Meanwhile, before the compound semiconductor layers are formed, a buffer layer (not shown) may be formed. The buffer layer is employed to reduce the lattice mismatch between the growth substrate 21 and the compound semiconductor layers, and may be a GaN-based material layer, for example, of GaN or AlN.

Figure 12:
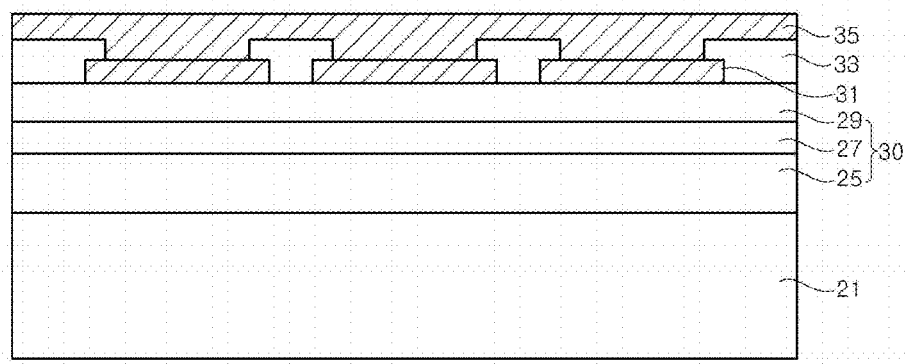

Referring to FIG. 12, a reflective metal layer 31 is formed on the semiconductor stack 30. The reflective metal layer 31 has grooves through which the semiconductor stack 30 is exposed. For example, the reflective metal layer 31 may be formed of a plurality of plates, and the grooves may be formed between the plurality of plates (see FIG. 7).

Subsequently, a lower insulating layer 33 is formed to cover the reflective metal layer 31. The lower insulating layer 33 fills the grooves in the reflective metal layer 31, and covers side surfaces and edges of the reflective metal layer 31. The lower insulating layer 33 has openings through which the reflective metal layer 31 is exposed. The lower insulating layer 33 may be formed of a silicon oxide or silicon nitride, and may be formed as a DBR obtained by alternately stacking insulating layers whose refractive indices are different from each other.

A barrier metal layer 35 is formed on the lower insulating layer 33. The barrier metal layer 35 may be in contact with the reflective metal layer 31 by filling the openings formed in the lower insulating layer 33.

Figure 13:
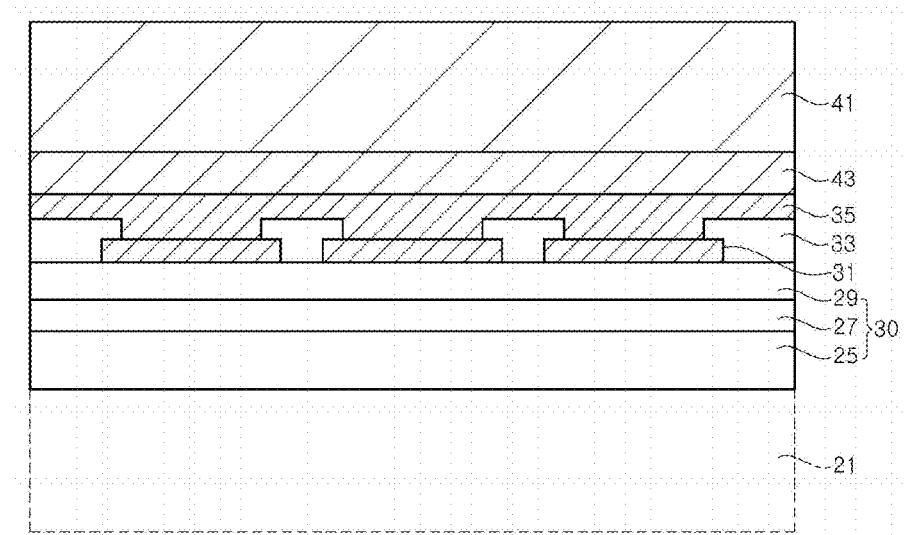

Referring to FIG. 13, a support substrate 41 is attached onto the barrier metal layer 35. The support substrate 41 may be formed separately from the semiconductor stack 30 and then bonded onto the barrier metal layer 35 by means of a bonding metal 43. Alternatively, the support substrate 41 may be formed on the barrier metal layer 35 through a plating technique.

Then, a surface of the n-type semiconductor layer 25 in the semiconductor stack 30 is exposed by removing the growth substrate 21. The growth substrate 21 may be removed using a laser lift-off (LLO) technique.

Figure 14:
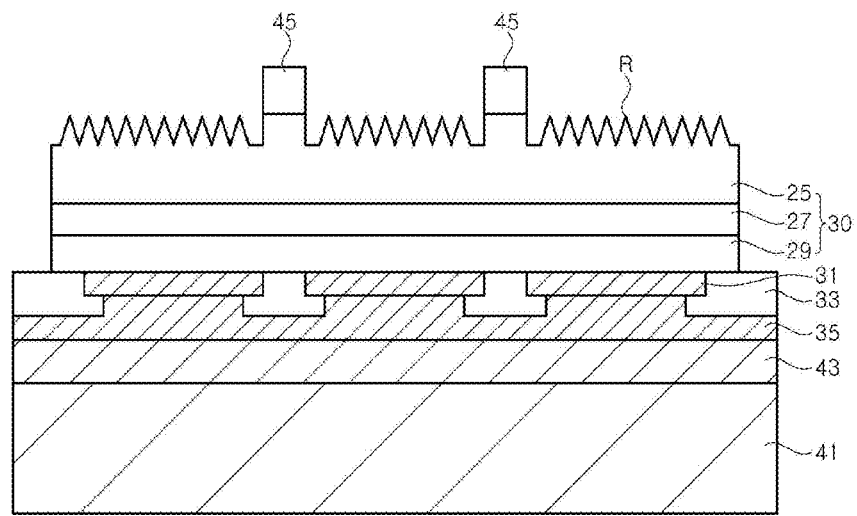

Referring to FIG. 14, a mask pattern 45 is formed on the exposed n-type semiconductor layer 25. The mask pattern 45 covers only a region of the n-type semiconductor layer 25, corresponding to the groove of the reflective metal layer 31, and exposes the other regions of the n-type semiconductor layer 25. Particularly, the mask pattern 45 covers the region of the n-type semiconductor layer 25, in which n-electrode pads 51 and electrode extensions 51a will be formed later. The mask pattern 45 may be formed of a polymer such as a photoresist.

Subsequently, the surface of the n-type semiconductor layer 25 is anisotropically etched using the mask pattern 45 as an etching mask, thereby forming a roughened surface R on the n-type semiconductor layer 25. Then, the mask pattern 45 is removed. A portion of the surface of the n-type semiconductor layer 25, on which the mask pattern 45 is positioned, is maintained as a flat surface.

Meanwhile, a chip separation region is formed by patterning the semiconductor stack 30, and the lower insulating layer 33 is exposed. The chip separation region may be formed before or after the roughened surface R is formed.

Figure 15:
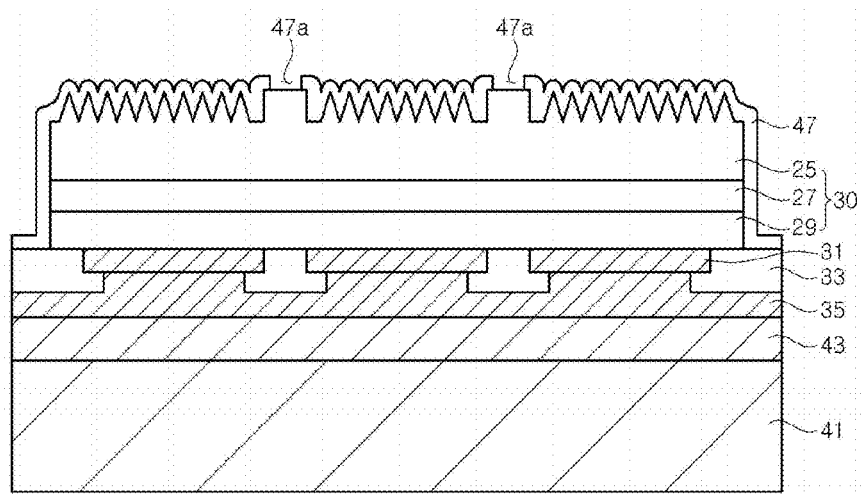

Referring to FIG. 15, an upper insulating layer 47 is formed on the n-type semiconductor layer 25 having the roughened surface R formed thereon. The upper insulating layer 47 is formed along the roughened surface R to have an uneven surface corresponding to the roughened surface R. The upper insulating layer 47 covers the flat surface on which an n-electrode pad 51 will be formed. The upper insulating layer 47 may cover the side surfaces of the semiconductor stack 30 exposed to the chip separation region. The upper insulating layer 47 has an opening 47a for exposing the flat surface of a region in which an electrode extension 51a will be formed.

Subsequently, the n-electrode pad 51 is formed on the upper insulating layer 47, and the electrode extension 51a is formed in the opening 47a. The electrode extension 51a extends from the n-electrode pad 51, and is electrically connected to the semiconductor stack 30.

Then, the support substrate is divided into individual chips along the chip separation region, thereby completing the fabrication of an LED (see FIG. 8).

Figure 16:
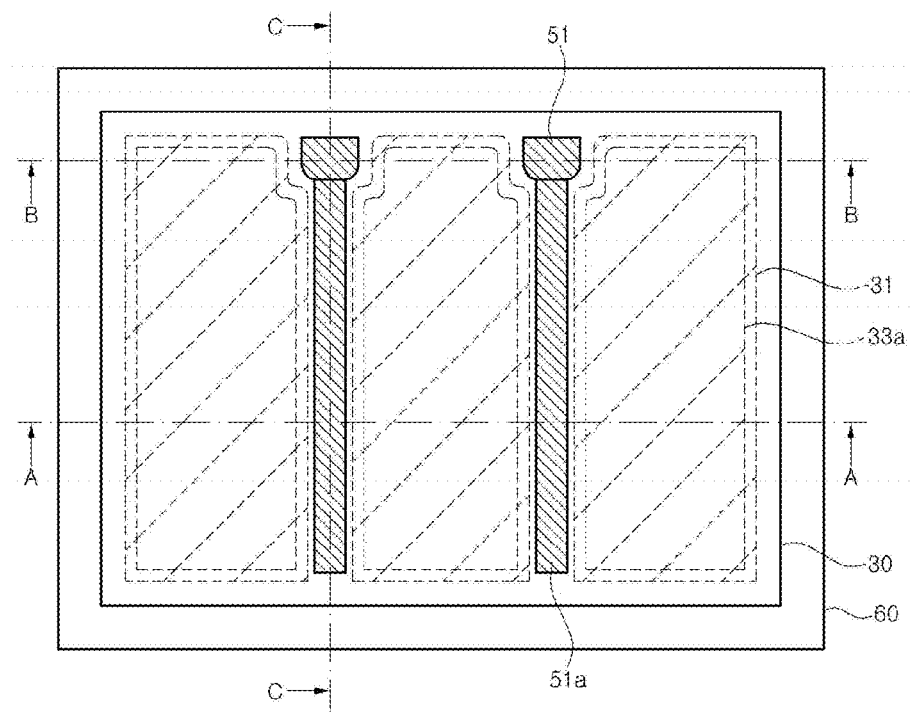
FIG. 16 is a schematic layout of an LED according to an exemplary embodiment of the present invention.
Figure 17:
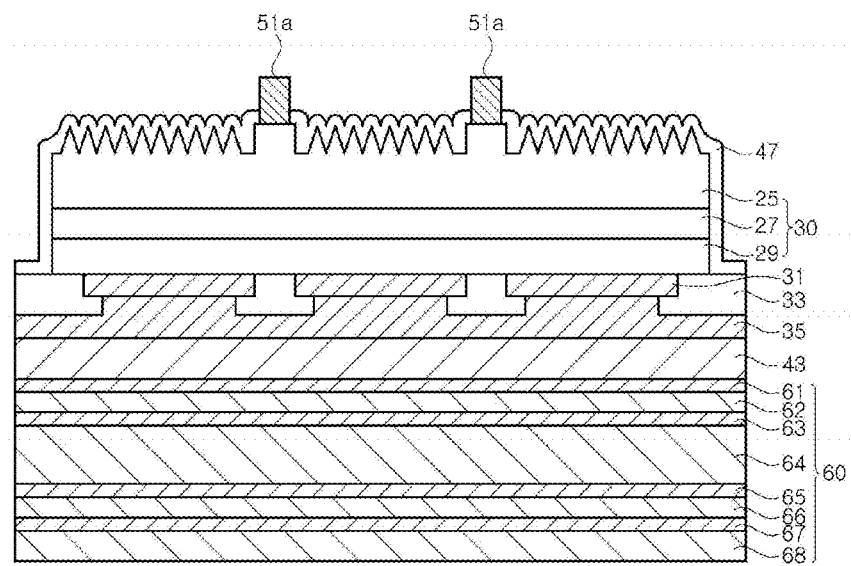
FIG. 17 is a sectional view taken along line A-A of FIG. 16.
Figure 18:
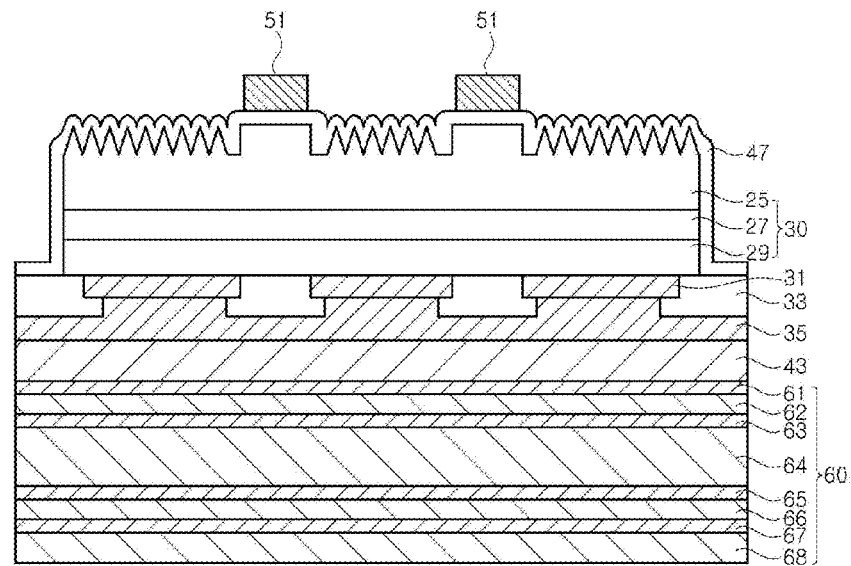
FIG. 18 is a sectional view taken along line B-B of FIG. 16.
Figure 19:
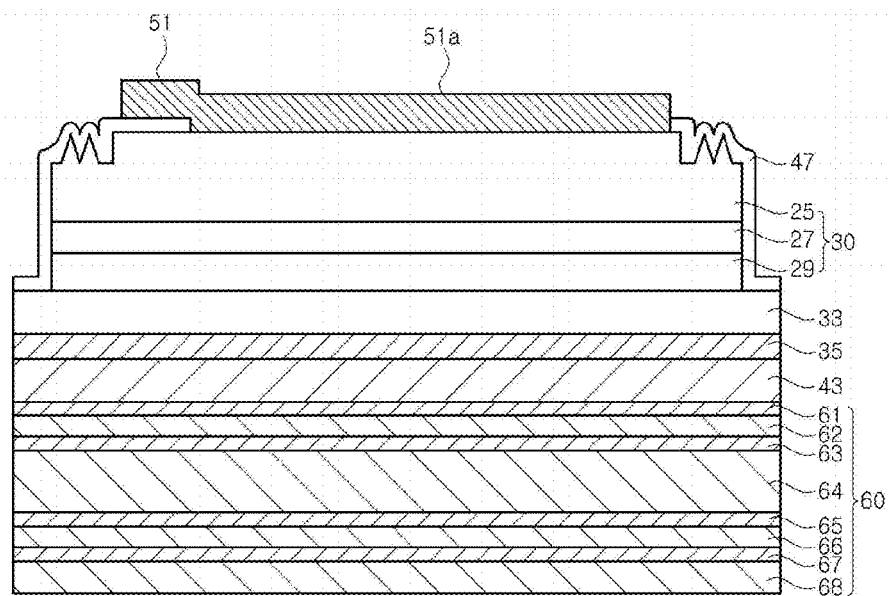
FIG. 19 is a sectional view taken along line C-C of FIG. 16.

FIG. 16 is a schematic layout of an LED according to a exemplary embodiment of the present invention. FIGS. 17, 18, and 19 are sectional views taken along lines A-A, B-B and C-C, respectively, of FIG. 16. In FIG. 16, a reflective metal layer 31 and a lower insulating layer 33, positioned beneath a semiconductor stack 30, are designated by dotted lines.

Referring to FIGS. 16 to 19, the LED is similar to the LED described with reference to FIGS. 7 to 10, but is different in that the LED includes a support substrate 60 having a specific material and structure.

In the present exemplary embodiment, the support substrate 60 is a secondary substrate attached to the previously grown compound semiconductor layers, and may be a conductive substrate, e.g., a metallic substrate.

The support substrate 60 includes a first metal layer 64 positioned at the center thereof, and second metal layers 62 and 66 disposed to be symmetrical to each other at upper and lower portions of the first metal layer 64. The first metal layer 64 may include, for example, at least one of tungsten (W) or molybdenum (Mo). The second metal layers 62 and 66 are made of a material having a thermal expansion coefficient higher than that of the first metal layer 64, and may include copper (Cu), for example. Adhesive layers 63 and 65 are formed between the first metal layer 64 and the second metal layer 62 and between the first metal layer 64 and the second metal layer 66, respectively. In addition, an adhesive layer 61 is formed between a bonding metal 43 and the second metal layer 62. These adhesive layers 61, 63 and 65 may include at least one of Ni, Ti, Cr and Pt. A lower bonding metal 68 may be formed on a bottom surface of the second metal layer 66 positioned under the first metal layer 64 by means of an adhesive layer 67. The lower bonding metal 68 has a structure symmetrical to the bonding metal 43 interposed between the support substrate 60 and the semiconductor stacked structure 30. The lower bonding metal 68 may be made of the same material as the boning metal 43, and may be made, for example, of Au or Au—Sn (80/20 wt %). The lower bonding metal 68 may be used to attach the support substrate 60 to an electronic circuit or printed circuit board (PCB).

In the present exemplary embodiment, the support substrate 60 has a structure including the first metal layer 64 and the second metal layers 62 and 66 formed to be symmetrical with each other on top and bottom surfaces of the first metal layer 64. The material, e.g., W or Mo, which constitutes the first metal layer 66, has a relatively lower thermal expansion coefficient and a relatively higher hardness than the material, e.g., Cu, which constitutes the second metal layers 62 and 66. The thickness of the first metal layer 64 is formed to be greater than those of the second metal layers 62 and 66. Accordingly, the structure in which the second metal layers 62 and 66 are respectively formed on the top and bottom surfaces of the first metal layer 64 may be formed as compared with its opposite structure (in which first metal layers are respectively formed on top and bottom surfaces of a second metal layer). The thickness of the first metal layer 64 and the thicknesses of the second metal layers 62 and 66 may be appropriately controlled so that the support substrate 60 may have a thermal expansion coefficient similar to those of the growth substrate and the semiconductor stacking substrate 30.

The support substrate 60 may be formed separately from the semiconductor staking structure 30 and then bonded onto a barrier metal layer 35 through the bonding metal 43. The bonding metal 43 may be formed of, for example, Au or Au—Sn (80/20 wt %) using an eutectic bonding. Alternatively, the support substrate 60 may be formed on the barrier metal layer 35 through a plating or deposition technique. For example, the support substrate 60 may be plated using an electrolytic plating method for precipitating a metal using a rectifier or using an electroless plating method for precipitating a metal using a reducing agent. Alternatively, the support substrate 60 may be deposited by using a method such as heat deposition, electron-beam evaporation, sputtering, or chemical vapor deposition (CVD).

Figure 20:
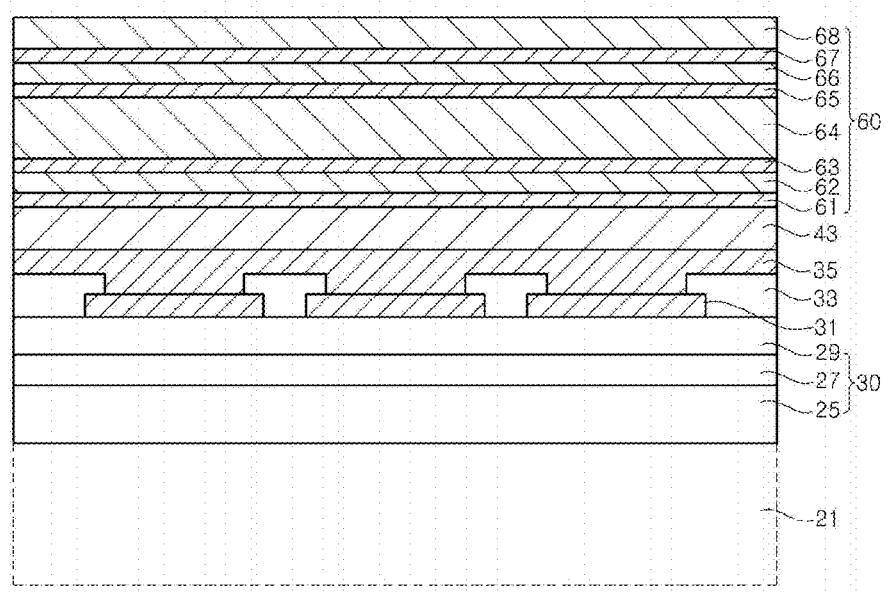
FIG. 20, FIG. 21, and FIG. 22 are sectional views illustrating a method of fabricating the LED according to an exemplary embodiment of the present invention, each of which corresponds to the sectional view taken along line A-A of FIG. 16.
Figure 21:
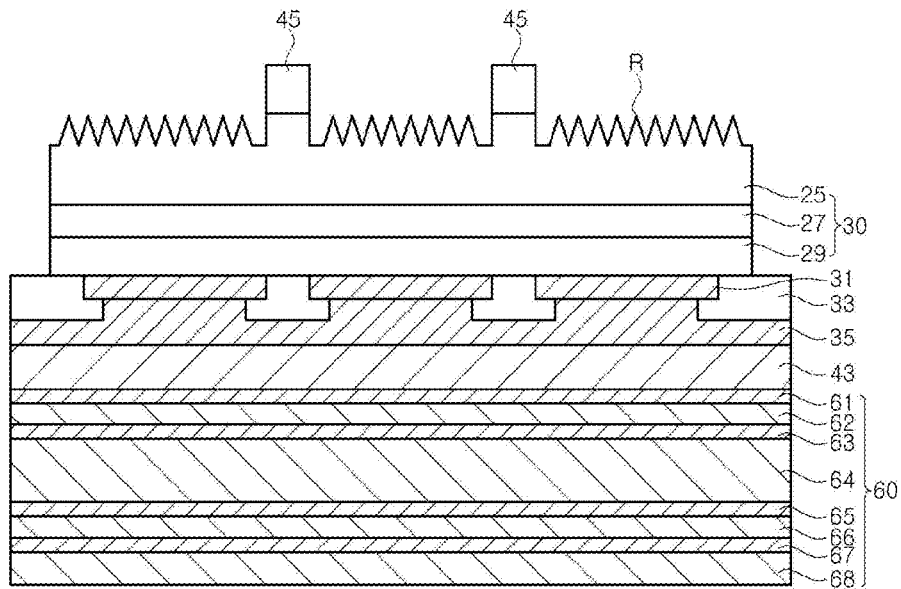
Figure 22:
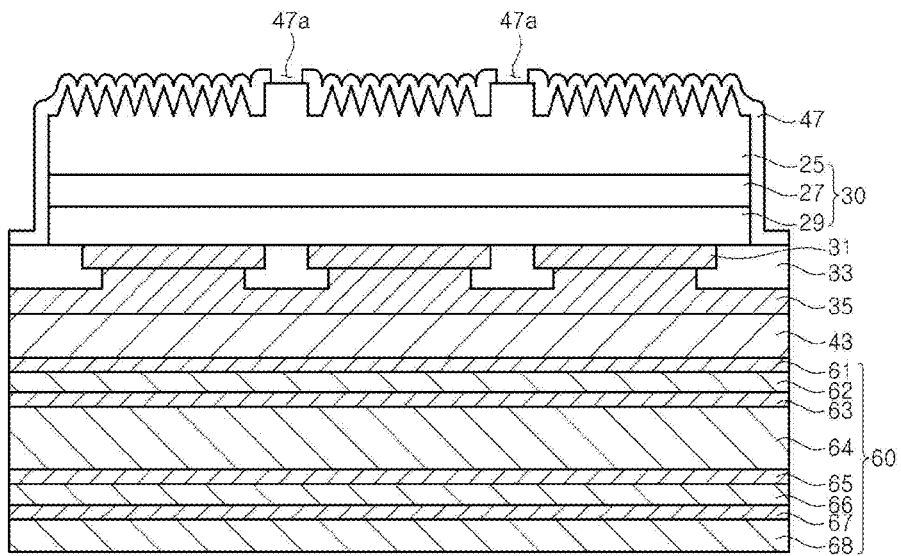

FIGS. 20 to 22 are sectional views illustrating a method of fabricating the LED according to an exemplary embodiment of the present invention. Here, each of the sectional views corresponds to the sectional view taken along line A-A of FIG. 16.

Referring to FIG. 20, a semiconductor stack 30 including an n-type semiconductor layer 25, an active layer 27 and a p-type semiconductor layer 29 is first formed on a growth substrate 21, as described with reference to FIG. 10. Then, a reflective metal layer 31, a lower insulating layer 33 and a barrier metal layer 35 are formed on the semiconductor stack 30, as described with reference to FIG. 12.

Subsequently, a support substrate 60 is attached on the barrier metal layer 35. The support substrate 60 may be formed separately from the semiconductor stack 30 and then bonded onto the barrier metal layer 35 by means of a bonding metal 43.

As described with reference to FIGS. 16 to 19, the support substrate 60 includes a first metal layer 64 positioned at the center thereof, and second metal layers 62 and 66 disposed to be symmetrical to each other at upper and lower portions of the first metal layer 64. The first metal layer 64 may include, for example, at least one of tungsten (W) or molybdenum (Mo). The second metal layers 62 and 66 are made of a material having a thermal expansion coefficient higher than that of the first metal layer 64, and may include copper (Cu), for example. Adhesive layers 63 and 65 are formed between the first metal layer 64 and the second metal layer 62 and between the first metal layer 64 and the second metal layer 66, respectively. In addition, an adhesive layer 61 is formed between the bonding metal 43 and the second metal layer 62. These adhesive layers 61, 63 and 65 may include at least one of Ni, Ti, Cr and Pt. A lower bonding metal 68 may be formed on a bottom surface of the second metal layer 66 by means of an adhesive layer 67. The lower bonding metal 68 may be used to attach the support substrate 60 to an electronic circuit or PCB.

In the present exemplary embodiment, the support substrate 60 has a structure including the first metal layer 64 and the second metal layers 62 and 66 formed to be symmetrical with each other on top and bottom surfaces of the first metal layer 64. The material, e.g., W or Mo, which constitutes the first metal layer 66, has a relatively lower thermal expansion coefficient and a relatively higher hardness than the material, e.g., Cu, that constitutes the second metal layers 62 and 66. The thickness of the first metal layer 64 is formed to be greater than those of the second metal layers 62 and 66. The thickness of the first metal layer 64 and the thicknesses of the second metal layers 62 and 66 may be appropriately controlled so that the support substrate 60 may have a thermal expansion coefficient similar to those of the growth substrate and the semiconductor stacking substrate 30.

Through the aforementioned structure of the support substrate 60, the stress which might be due to the differences of thermal expansion coefficients among the growth substrate 21, the semiconductor stack 30 and the support substrate 60 can be effectively reduced through a heat process for performing the bonding of the support substrate 60 or its subsequent processes, and may thereby prevent damage and bending of the compound semiconductor layers.

A high-temperature atmosphere is required to perform the bonding of the support substrate 60, and a pressure may be applied to the support substrate 60 so that the bonding of the support substrate 60 may be easily performed. The pressure may be applied only during the bonding process by means of a pressure applying plate disposed at an upper portion of a high-temperature chamber, and may be removed after the bonding is completed.

Alternatively, the pressure may be applied by a holder for holding the support substrate 60 and the growth substrate 21 at both sides thereof. Therefore, the pressure may be applied separately from the chamber under the high-temperature atmosphere. Accordingly, after the support substrate 60 is bonded, the pressure can be maintained even at the normal temperature.

A grinding process or an LLO process may be used as the process for removing the growth substrate after the bonding of the support substrate 60. In this case, to reduce the bending which may be caused by the difference of thermal expansion coefficients, the holder on which the growth substrate 21 is mounted may be heated to a certain temperature at which the bending can be reduced. In order to prevent the support substrate 60 and the semiconductor stack from being damaged due to the impact which might be caused by the gas generated in the process for separating the growth substrate 21 and the emission of laser beam in the LLO process, the LLO process may be performed in the state that the holder for holding the growth substrate 21 and the support substrate 60 is maintained to be mounted.

Alternatively, the support substrate 60 may be formed on the barrier metal layer 35 using a plating technique, for example.

After the support substrate 60 is formed, the growth substrate 21 is removed so that a surface of the n-type semiconductor layer 25 in the semiconductor stack 30 is exposed. The growth substrate 21 may be removed by radiating laser through the growth substrate 21 and separating the growth substrate 21 through the LLO process. At this time, the energy of the laser is selected to be smaller than the energy bandgap of the growth substrate 21 and greater than the energy bandgap of a buffer layer (not shown).

Referring to FIG. 21, a mask pattern 45 is formed on the exposed n-type semiconductor layer 25, and a roughened surface R is formed on the n-type semiconductor layer 25 by anisotropically etching a surface of the n-type semiconductor layer 25 using the mask pattern 45 as an etching mask, as described with reference to FIG. 14. Then, the mask pattern 45 is removed.

Meanwhile, a chip separation region is formed by patterning the semiconductor stack 30, and the lower insulating layer 33 is exposed. The chip separation region may be formed before or after the roughened surface R is formed.

Referring to FIG. 22, an upper insulating layer 47 is formed on the n-type semiconductor layer 25 having the roughened surface R formed thereon, as described with reference to FIG. 15. Subsequently, the n-electrode pad 51 is formed on the upper insulating layer 47, and the electrode extension is formed in the opening 47a. The electrode extension 51a extends from the n-electrode pad 51, and is electrically connected to the semiconductor stack 30. Then, the support substrate 60 is divided into individual chips along the chip separation region, thereby completing the fabrication of an LED (see FIG. 17).

Figure 23:
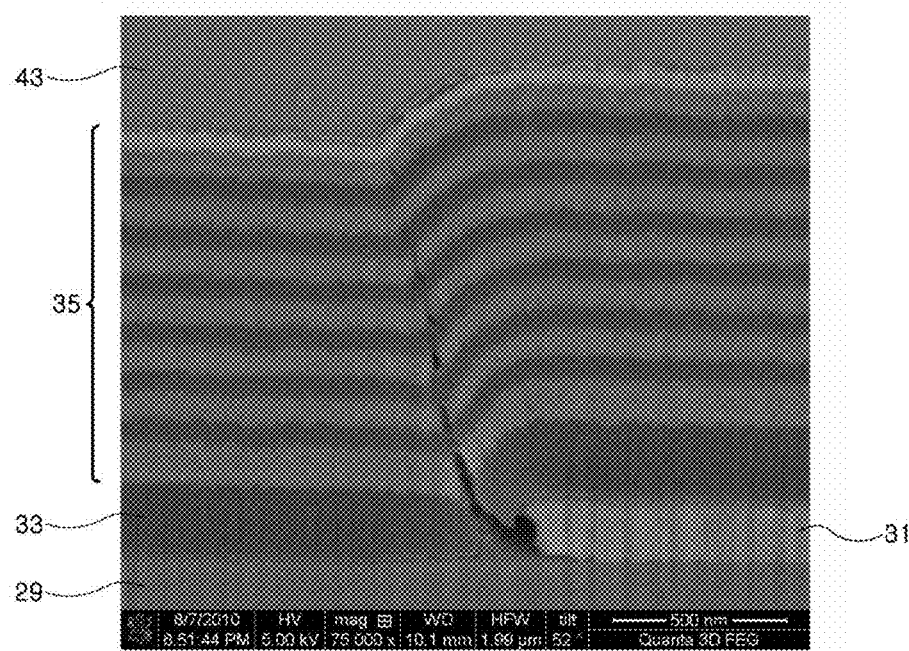
FIG. 23 is a scanning electron microscope (SEM) sectional photograph showing an edge portion of a reflective metal layer, for illustrating a problem that may be caused in the fabrication process of a vertical LED.

FIG. 23 is a scanning electron microscope (SEM) sectional photograph showing an edge portion of a reflective metal layer, for illustrating a problem that may be caused in a vertical LED.

Referring to FIG. 23, a reflective metal layer 31 is formed on a p-type semiconductor layer 29, and the edge of the reflective metal layer 31 is covered by an insulating layer 33. The insulating layer 33 is patterned to have grooves (not shown) through which the reflective metal layer 31 is exposed. A barrier metal layer 35 is formed on the insulating layer 33 and the reflective metal layer 31 which is exposed by the grooves. Subsequently, a bonding metal 43 is formed on the barrier metal layer 35, and a support substrate (not shown) is attached on the barrier metal layer 35 with the bonding metal 43 interposed therebetween. The reflective metal layer 31 includes silver (Ag), and the insulating layer 33 is formed of $SiO_2$. The barrier metal layer 35 is formed by repeatedly stacking Pt, Ni, Ti, W, or an alloy thereof.

As shown in FIG. 23, cracks are produced in the insulating layer 33 and the barrier metal layer 35 in the vicinity of the edge of the reflective metal layer 31. It should be appreciated that such cracks are produced even when the insulating layer 33 is not used, i.e., even when the barrier metal layer 35 is directly formed on the reflective metal layer 31. The cracks are formed to be relatively wider in the vicinity of the reflective metal layer 31. The more spaced away from the reflective metal layer 31 the cracks are, the narrower the cracks. The cracks are connected throughout almost all the entire thickness of the barrier metal layer 35.

The cracks may be formed because the thermal expansion coefficient of the reflective metal layer 31 is relatively greater than those of the insulating layer 33 and the barrier metal layer 35. That is, since the reflective metal layer 31 is relatively more expanded than the insulating layer 33 and the barrier metal layer 35 when a heating process is performed, the stress is concentrated on the edge of the reflective metal layer 31, and accordingly, the cracks are produced in the insulating layer 33 close to the reflective metal layer 31 so that the cracks may be transferred to the barrier metal layer 35.

As the cracks are produced, the electrical property of the reflective metal layer 31 is changed in the vicinity of the edge of the reflective metal layer 31, and further, a problem such as interface exfoliation occurs between the reflective metal layer 31 and the p-type semiconductor layer 29, thereby deteriorating the ohmic property of the reflective metal layer 31. Since the cracks are produced on a surface of the p-type semiconductor layer 29, the reliability of the LED may be deteriorated.

Accordingly, an LED will be described below, which can prevent a reflective metal layer from being exposed to the outside thereof and prevent the electrical property and reliability of the reflective metal layer from being deteriorated due to the cracks produced in the vicinity of an edge of the reflective metal layer.

Figure 24:
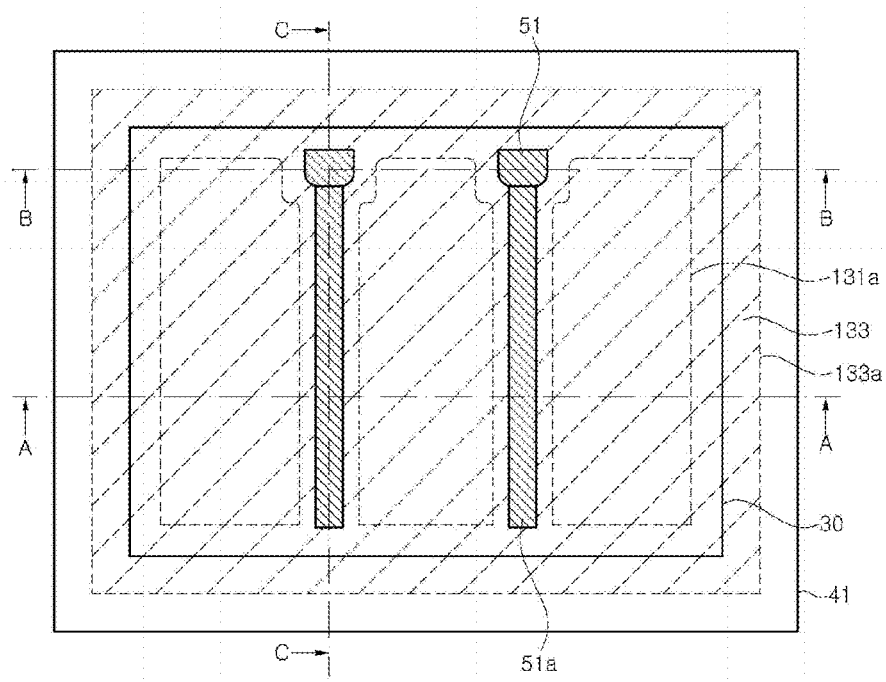
FIG. 24 is a schematic layout of an LED according to an exemplary embodiment of the present invention.
Figure 25:
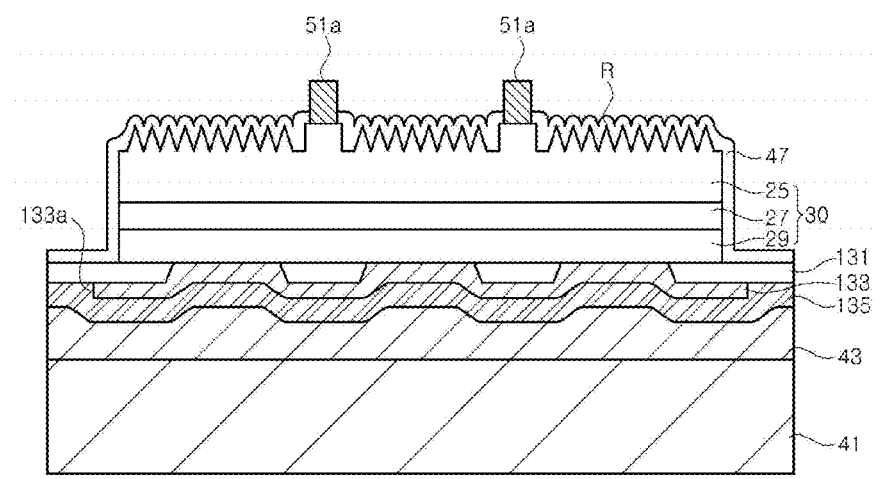
FIG. 25 is a sectional view taken along line A-A of FIG. 24.
Figure 26:
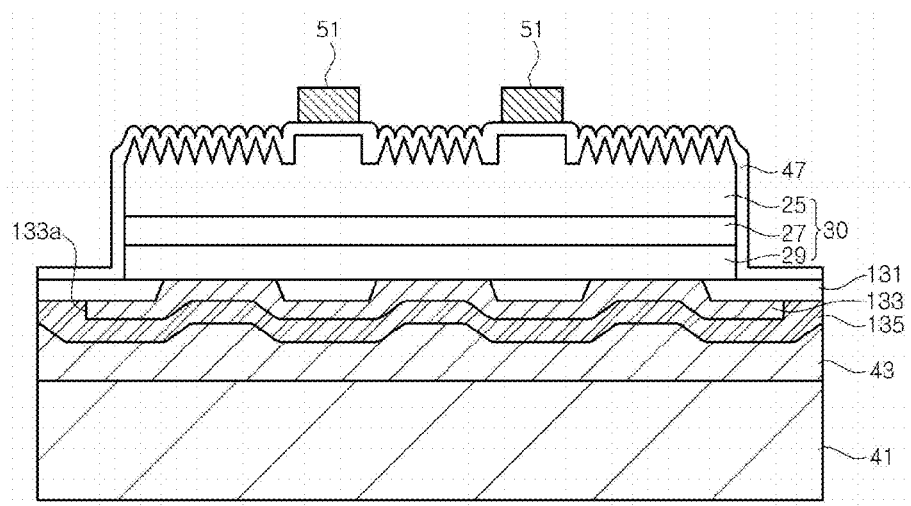
FIG. 26 is a sectional view taken along line B-B of FIG. 24.
Figure 27:
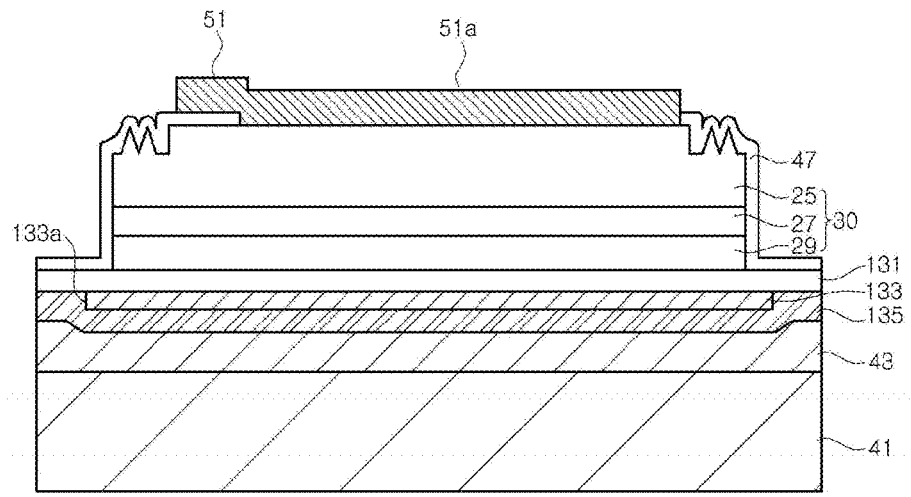
FIG. 27 is a sectional view taken along line C-C of FIG. 24.

FIG. 24 is a schematic layout of an LED according to an exemplary embodiment of the present invention. FIGS. 25, 26, and 27 are sectional views taken along lines A-A, B-B and C-C, respectively, of FIG. 24. In FIG. 24, grooves 131a in a protection layer 131, and a reflective metal layer 133, positioned beneath a semiconductor stack 30, are designated by dotted lines.

Referring to FIGS. 24 to 27, the LED is similar to the LED described with reference to FIGS. 7 to 10 but different in relation to a protection layer 131, a reflective metal layer 133, and a barrier metal layer 135. Hereinafter, the descriptions of the components identical to those of the FIGS. 7 to 10 will be omitted to avoid redundancy, and only the differences will be described in detail.

The protection layer 131 is positioned between a semiconductor stack 30 and a support substrate 41, and has a groove 131a through which the semiconductor stack 30, e.g., a p-type compound semiconductor layer 29 is exposed. The protection layer 131 may have a plurality of grooves 131a through which the semiconductor stack 30 is exposed. As shown in these figures, sidewalls of the groove 131a may be inclined. Accordingly, the inclined sidewalls of the groove 131a can prevent or reduce cracks from being generated in the reflective metal layer 133 and the barrier metal layer 135.

The protection layer 131 extends to the outside of the semiconductor stack 30 and is positioned beneath side surfaces of the semiconductor stack 30, so that an upper surface of the reflective metal layer 133 can be prevented from being exposed toward the semiconductor stack 30.

The protection layer 131 may be a single- or multi-layered structure made of silicon oxide or silicon nitride, and may be a DBR obtained by repeatedly stacking insulating layers, e.g., $SiO_2/TiO_2$ or $SiO_2/Nb_2O_5$, whose refractive indices are different from each other. Alternatively, the protection layer 131 may be a metal layer, for example, of Ti, which is in schottky contact with the semiconductor stack 30, e.g., the p-type compound semiconductor layer 29.

The reflective metal layer 133 is positioned between the protection layer 131 and the support substrate 41, and ohmic-contacted with the semiconductor stack 30, e.g., the p-type compound semiconductor layer 29 by filling the groove 131a of the protection layer 131. The reflective metal layer 133 may include a reflection layer made of, for example, Ag. An edge 133a or a side surface of the reflective metal layer 133 is positioned beneath the protection layer 131. That is, the edge of the reflective metal layer 133 is positioned between the protection layer 131 and the support substrate 41. As shown in FIG. 24, the edge 133a of the reflective metal layer 133 may be positioned between an edge of the semiconductor stack 30 and an edge of the support substrate 41. That is, the semiconductor stack 30 is positioned to be confined in an upper region of the region surrounded by the edge 133a of the reflective metal layer 133.

Meanwhile, the barrier metal layer 135 is positioned between the reflective metal layer 133 and the support substrate 41, and covers the edge 133a of the reflective metal layer 133 so as to surround the reflective metal layer 133. That is, side and bottom surfaces of the reflective metal layer 133 are covered by the barrier metal layer 135. The barrier metal layer 135 prevents the movement of a metallic material, e.g., Ag, in the reflective metal layer 133, and prevents the side surfaces of the reflective metal layer 133 from being exposed to the outside. The barrier metal layer 135 may include, for example, Pt, Ni, Ti, W, or an alloy thereof. The barrier metal layer may be positioned on the whole surface of the support substrate 41.

Meanwhile, an n-electrode pad 51 is positioned on the semiconductor stack 30, and an electrode extension 51a extends from the n-electrode pad 51. A plurality of n-electrode pads 51 may be positioned on the semiconductor stack 30, and electrode extensions 51a may extend from the plurality of n-electrode pads 51, respectively. The electrode extensions 51a are electrically connected to the semiconductor stack 30, and may come in direct contact with an n-type compound semiconductor layer 25.

The n-electrode pad 51 may be also positioned above a region of the protection layer 131. That is, the reflective metal layer 133 immediately under the n-electrode pad 51 is not ohmic-contacted with the p-type compound semiconductor layer 29 but the protection layer 131 is positioned immediately under the n-electrode pad 51 instead of the reflective metal layer 133. The electrode extension 51a may also be positioned above a region of the protection layer 131. Accordingly, the current flow can be prevented from being concentrated from the electrode extension 51a toward a portion just under the electrode extension 51a.

FIGS. 28 to 31 are sectional views illustrating a method of fabricating the LED according to an exemplary embodiment of the present invention. Here, each of the sectional views corresponds to the sectional view taken along line A-A of FIG. 24.

Figure 28:
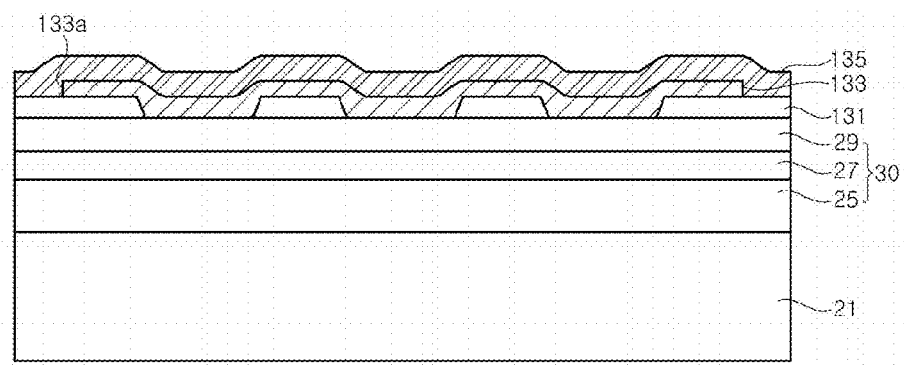
FIG. 28, FIG. 29, FIG. 30, and FIG. 31 are sectional views illustrating a method of fabricating the LED according to an exemplary embodiment of the present invention, each of which corresponds to the sectional view taken along line A-A of FIG. 24.

Referring to FIG. 28, a semiconductor stack 30 including an n-type semiconductor layer 25, an active layer 27 and a p-type semiconductor layer 29 is first formed on a growth substrate 21, as described with reference to FIG. 11. A protection layer 131 is formed on the semiconductor stack 30. The protection layer 131 has grooves (see 131a of FIG. 24) through which the semiconductor stack 30 is exposed. Sidewalls of the grooves 131a may be formed to be inclined. The protection layer 131 may be formed of a silicon oxide layer or a silicon nitride layer, and may be a DBR obtained by alternately stacking insulating layers whose refractive indices are different from each other. Alternatively, the protection layer 131 may be a metal layer which is in schottky contact with the semiconductor stack 30, e.g., the p-type compound semiconductor layer 29.

A reflective metal layer 133 is formed on the protection layer 131. The reflective metal layer 133 covers the protection layer 131, and is ohmic-contacted with the semiconductor stack 30 by filling the grooves of the protection layer 131. The reflective metal layer 133 includes a reflective metal, for example, Ag. Meanwhile, an edge of the reflective metal layer 133 is positioned on the protection layer 131. The reflective metal layer 133 may be formed in the shape of a continuous plate on every region of an individual LED.

Subsequently, a barrier metal layer 135 is formed on the reflective metal layer 133. The barrier metal layer 135 covers a top surface of the reflective metal layer 133 and the edge 133a of the reflective metal layer 133 so as to surround the reflective metal layer 133.

Figure 29:
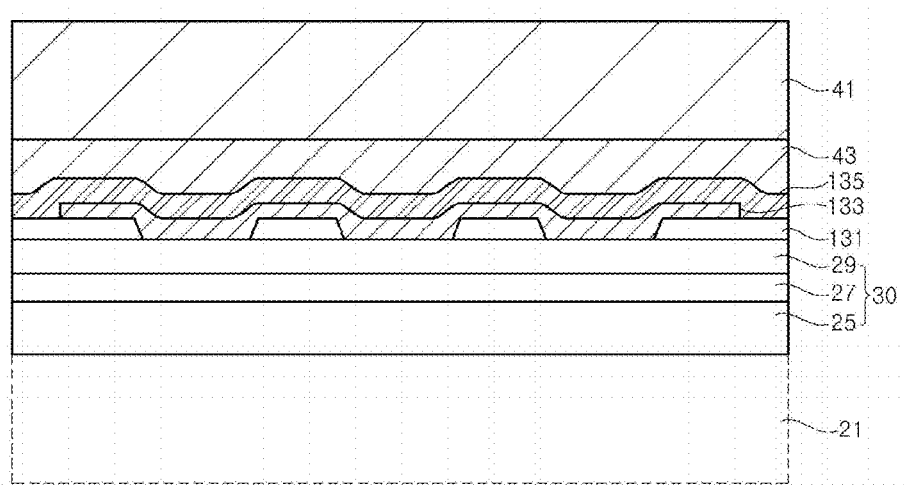

Referring to FIG. 29, a support substrate 41 is attached on the barrier metal layer 135, as described with reference to FIG. 13. Then, a surface of the n-type semiconductor layer 25 is exposed by removing the growth substrate 21.

Figure 30:
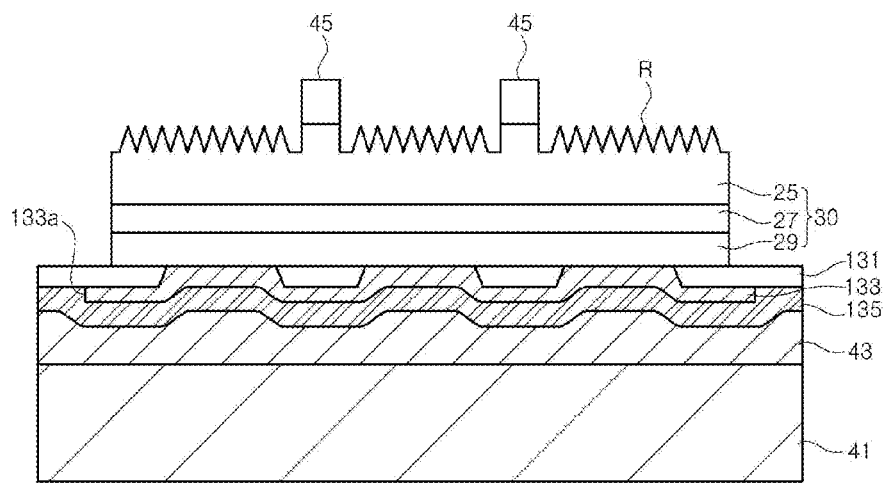

Referring to FIG. 30, a mask pattern 45 is formed on the exposed n-type semiconductor layer 25. The mask pattern 45 covers a region of the n-type semiconductor layer 25 above a region of the protection layer 131, and exposes the other regions of the n-type semiconductor layer 25. Particularly, the mask pattern 45 covers the region of the n-type semiconductor layer 25, in which n-electrode pads and electrode extensions will be formed later. The mask pattern 45 may be formed of a polymer such as a photoresist.

Subsequently, a roughened surface R is formed on the n-type semiconductor layer 25 by anisotropically etching the surface of the n-type semiconductor layer 25 using the mask pattern 45 as an etching mask. Then, the mask pattern 45 is removed. The surface of the n-type semiconductor layer 25, on which the mask pattern 45 is positioned, is maintained as a flat surface.

Meanwhile, a chip separation region is formed by patterning the semiconductor stack 30, and the protection layer 131 is exposed. The chip separation region may be formed before or after the roughened surface R is formed. The edge of the reflective metal layer 133 is positioned beneath the protection layer 131 exposed to the chip separation region. Thus, the reflective metal layer 133 can be prevented from being exposed to the outside by the protection layer 131.

Figure 31:
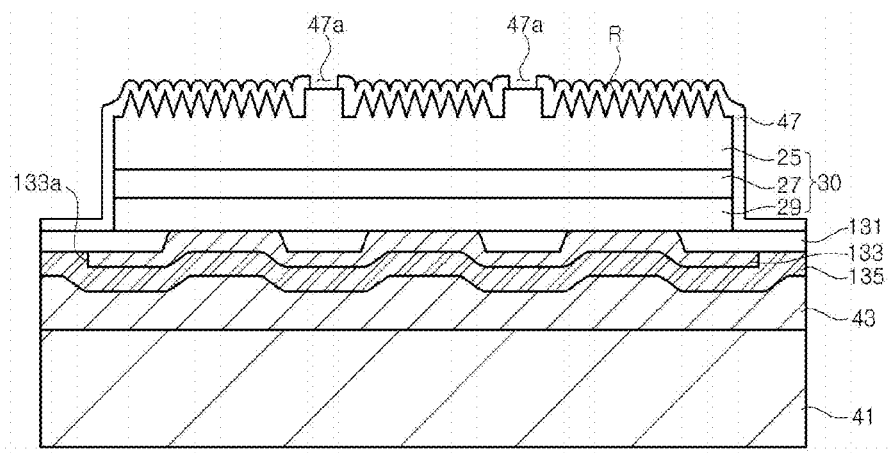

Referring to FIG. 31, an upper insulating layer 47 is formed on the n-type semiconductor layer 25 having the roughened surface R formed thereon, as described with reference to FIG. 15. The upper insulating layer 47 has an opening 47a for exposing a region of the flat surface in which an electrode extension 51a will be formed.

Subsequently, an n-electrode pad 51 is formed on the upper insulating layer 47, and an electrode extension is formed in the opening 47a. The electrode extension extends from the n-electrode pad 51, and is electrically connected to the semiconductor stack 30.

Then, the support substrate 41 is divided into individual chips along the chip separation region, thereby completing the fabrication of an LED (see FIG. 25). At this time, the protection layer 131, the barrier metal layer 135 and the support substrate 41 may be divided together with the support substrate, and therefore, their side surfaces may be parallel to one another. Meanwhile, the reflective metal layer is positioned in the region surrounded by an edge of the separated support substrate, and accordingly, the reflective metal layer 133 is not exposed to the outside but buried in the LED.

According to the present invention, it is possible to provide an LED in which an upper insulating layer is interposed between a first electrode pad and a semiconductor stack, thereby improving the current spreading performance. Further, the upper insulating layer is configured to have an uneven surface formed along a roughened surface of the semiconductor stack, thereby improving the light extraction efficiency of the LED. Furthermore, a surface of a p-type compound semiconductor layer under an electrode extension is covered by an insulating layer, so that the current flow may be prevented from being concentrated in a vertical direction from the electrode extension.

While the present invention has been illustrated and described in connection with the accompanying drawings and the exemplary embodiments, the present invention is not limited thereto and is defined by the appended claims. Therefore, it will be understood by those skilled in the art that various modifications and changes can be made thereto without departing from the spirit and scope of the invention defined by the appended claims.

What is claimed is:

1. A light emitting diode (LED), comprising:
   a substrate;
   a semiconductor stack disposed on the substrate, the semiconductor stack comprising:
      a p-type semiconductor layer;
      an active layer; and
      an n-type semiconductor layer;
   a first metal layer interposed between the substrate and the semiconductor stack, the first metal layer ohmic-contacted with the semiconductor stack;
   a first electrode pad disposed on the semiconductor stack;
   an electrode extension extending from the first electrode pad, the electrode extension comprising a contact region that directly contact the n-type semiconductor layer;
   a first insulating layer interposed between the substrate and the semiconductor stack, the first insulating layer covering a first region of the p-type semiconductor layer under the contact region of the electrode extension; and
   a second insulating layer interposed between the first electrode pad and the semiconductor stack, such that the second insulating layer prevents the first electrode pad from directly contacting the semiconductor stack,
   wherein the substrate comprises:
      a second metal layer comprising at least one of tungsten (W) and molybdenum (Mo);
      third metal layers arranged on first and second surfaces of the second metal layer, respectively, the third metal layers comprising a higher thermal expansion coefficient than the second metal layer; and
      adhesive layers interposed between the second metal layer and the third metal layers, respectively, the adhesive layers comprising at least one of nickel (Ni), titanium (Ti), chromium (Cr), and platinum (Pt).

2. The LED of claim 1, further comprising:
   a fourth metal layer,
   wherein the first metal layer comprises a groove exposing the semiconductor stack,
   wherein the first insulating layer is interposed between the first metal layer and the substrate, covers the first metal layer and fills the groove, and comprises openings exposing portions of the first metal layer, and
   wherein the fourth metal layer is interposed between the substrate and the first insulating layer, and covers the portions of the first metal layer exposed through the openings of the first insulating layer.

3. The LED of claim 2, wherein the first electrode pad and the electrode extension are arranged above a region of the groove.

4. The LED of claim 2, wherein the first metal layer comprises plates, the first insulating layer covers side surfaces and edges of the plates, and the plates are exposed by the openings of the first insulating layer, respectively.

5. The LED of claim 1, wherein the third metal layers comprise copper (Cu).

6. The LED of claim 1, further comprising:
   a first metal interposed between the substrate and the semiconductor stack; and
   a second metal formed on a surface of the third metal layer opposite to the surface of the third metal layer arranged on the second surface of the second metal layer, the second metal to be symmetrical to the first metal.

7. The LED of claim 1, wherein the semiconductor stack comprises a roughened surface, and wherein the second insulating layer covers the roughened surface and comprises an uneven surface along the roughened surface.

8. The LED of claim 7, wherein the semiconductor stack comprises a flat surface on which the first electrode pad and the electrode extension are arranged.

9. The LED of claim 8, wherein the electrode extension contacts the flat surface.

10. The LED of claim 7, wherein the roughened surface is arranged under the electrode extension.

11. The LED of claim 1, comprising:
    first electrode pads; and
    electrode extensions extending from the first electrode pads, respectively.

12. The LED of claim 1, wherein the first region of the p-type semiconductor layer is arranged directly under the contact region of the electrode extension.

13. A light emitting diode (LED), comprising:
    a substrate;
    a semiconductor stack disposed on the substrate, the semiconductor stack comprising:
       a p-type semiconductor layer;
       an active layer; and
       an n-type semiconductor layer;
    a first metal layer disposed between the substrate and the semiconductor stack, the first metal layer ohmic-contacted with the semiconductor stack;
    a first electrode pad disposed on the semiconductor stack;
    an electrode extension extending from the first electrode pad, the electrode extension comprising a contact region that directly contacts the n-type semiconductor layer;
    a first insulating layer disposed between the substrate and the semiconductor stack, the first insulating layer covering a first region of the p-type semiconductor layer, the first region being disposed directly under the contact region of the electrode extension; and a second insulating layer interposed between the first electrode pad and the semiconductor stack, such that the first electrode pad does not directly contact the semiconductor stack, wherein the substrate comprises:
- a second metal layer comprising at least one of tungsten (W) and molybdenum (Mo);
- third metal layers arranged on first and second surfaces of the second metal layer, respectively, the third metal layers comprising a higher thermal expansion coefficient than the second metal layer; and
- adhesive layers interposed between the second metal layer and the third metal layers, respectively, the adhesive layers comprising at least one of nickel (Ni), titanium (Ti), chromium (Cr), and platinum (Pt).

* * * * *